(12) United States Patent
Kim et al.

(10) Patent No.: US 11,862,647 B2
(45) Date of Patent: Jan. 2, 2024

(54) STACKABLE 3D ARTIFICIAL NEURAL NETWORK DEVICE AND MANUFACTURING METHOD THEREOF

(71) Applicant: Korea Advanced Institute of Science and Technology, Daejeon (KR)

(72) Inventors: Sanghyeon Kim, Daejeon (KR); Seong Kwang Kim, Daejeon (KR)

(73) Assignee: KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 79 days.

(21) Appl. No.: 17/114,711

(22) Filed: Dec. 8, 2020

(65) Prior Publication Data

US 2021/0175262 A1 Jun. 10, 2021

(30) Foreign Application Priority Data

Dec. 10, 2019 (KR) ........................ 10-2019-0163382

(51) Int. Cl.
*H01L 27/12* (2006.01)
*G06N 3/063* (2023.01)
*G06N 3/08* (2023.01)

(52) U.S. Cl.
CPC ......... *H01L 27/1259* (2013.01); *G06N 3/063* (2013.01); *H01L 27/124* (2013.01); *H01L 27/1237* (2013.01); *G06N 3/08* (2013.01); *H01L 27/1225* (2013.01)

(58) Field of Classification Search
CPC ............. H01L 27/1259; H01L 27/1237; H01L 27/124; H01L 27/1225; G06N 3/063; G06N 3/08
USPC ........................................................ 257/392
See application file for complete search history.

(56) References Cited

U.S. PATENT DOCUMENTS

2018/0138200 A1* 5/2018 Kim ...................... H01L 29/749

FOREIGN PATENT DOCUMENTS

KR 1020180086152 8/2020

\* cited by examiner

*Primary Examiner* — Ori Nadav
(74) *Attorney, Agent, or Firm* — Burns & Levinson, LLP; Joseph M. Maraia

(57) ABSTRACT

Various embodiments relate to a stackable 3D artificial neural network device and a manufacturing method thereof. According to various embodiments, a device is manufactured to include a substrate, a neuron block placed on some areas on one side of the substrate, a synapse block placed on the rest of the areas on one side of the substrate, and the neuron block and the synapse block may include at least one first channel element arranged on one side of the substrate and at least one second channel element stacked on the first channel element.

3 Claims, 22 Drawing Sheets

STACKABLE 3D ARTIFICIAL NEURAL NETWORK DEVICE AND MANUFACTURING METHOD THEREOF

CROSS REFERENCE TO RELATED APPLICATION

This application claims the priority benefit of Korean Patent Application No. 10-2019-0163382, filed on Dec. 10, 2019, Korean Intellectual Property Office, the disclosure of which is incorporated herein by reference.

BACKGROUND

1. Field of the Invention

The following embodiments relate to a stackable 3D ANN (artificial neural network) device and a manufacturing method thereof.

2. Description of Related Art

In general, an artificial neural network represents a system implemented based on a neural network of brain of a human or an animal. In other words, the artificial neural network implements a plurality of neurons and a plurality of synapses, and based on them, performs machine learning. At this time, the neurons perform a substantive computing function, and the synapses perform a function for transmitting signals between the neurons. When implementing such artificial neural network with hardware, multiple elements are required for one neuron, and similarly, multiple elements are required for one synapse. Due to this, when operating hardware, power consumption is great, and it is difficult to implement the hardware in a small size.

SUMMARY

Embodiments of the inventive concept provide a stackable 3D artificial neural network device that may be operated with reduced power consumption and a manufacturing method thereof.

Embodiments of the inventive concept provide a stackable 3D artificial neural network device that may be implemented in small size and a manufacturing method thereof.

According to various embodiments, a device relates to a stackable 3D artificial neural network device, may include a substrate, a neuron block placed on a partial area on one surface of the substrate, a synapse block placed on the rest of the areas on the surface of the substrate, and at least one coupling element electrically connecting the neuron block and the synapse block.

According to various embodiments, the neuron block and the synapse block respectively may include at least one first channel element arranged on one side of the substrate, and at least one second channel element to be respectively stacked on the first channel element.

According to various embodiments, a manufacturing method of a device relates to a manufacturing method of a stackable 3D artificial neural network device, may include preparing a substrate, forming a neuron block and a synapse block together on one surface of the substrate, and electrically connecting the neuron block and the synapse block through at least one coupling element.

According to various embodiments, the forming of the neuron block and the synapse block together may include forming at least one first channel element on the surface of the substrate, and forming at least one second channel element to be respectively stacked on the first channel element.

According to various embodiments, it may minimize signal transmission pathway in an artificial neural network device. In other words, as a neuron block functioning as neurons and a synapse block functioning as synapses are stacked together on a single substrate and the neuron block and the synapse block are implemented in a form that a first channel element and a second element are stacked, the signal transmission pathway may be minimized between the neuron block and the synapse block and between the first channel element and the second channel element. Accordingly, since signal loss on the signal transmission pathway may be minimized, the artificial neural network device may not only operate with reduced power consumption but also be implemented in small size. In addition, since the neuron block and the synapse block may be simultaneously manufactured on one surface of the substrate, the resources required to manufacture the device may be reduced.

BRIEF DESCRIPTION OF THE DRAWINGS

These and/or other aspects, features, and advantages of the present disclosure will become apparent and more readily appreciated from the following description of embodiments, taken in conjunction with the accompanying drawings of which.

DETAILED DESCRIPTION

Hereinafter, some embodiments will be described in detail with reference to the accompanying drawings.

Figure 1:
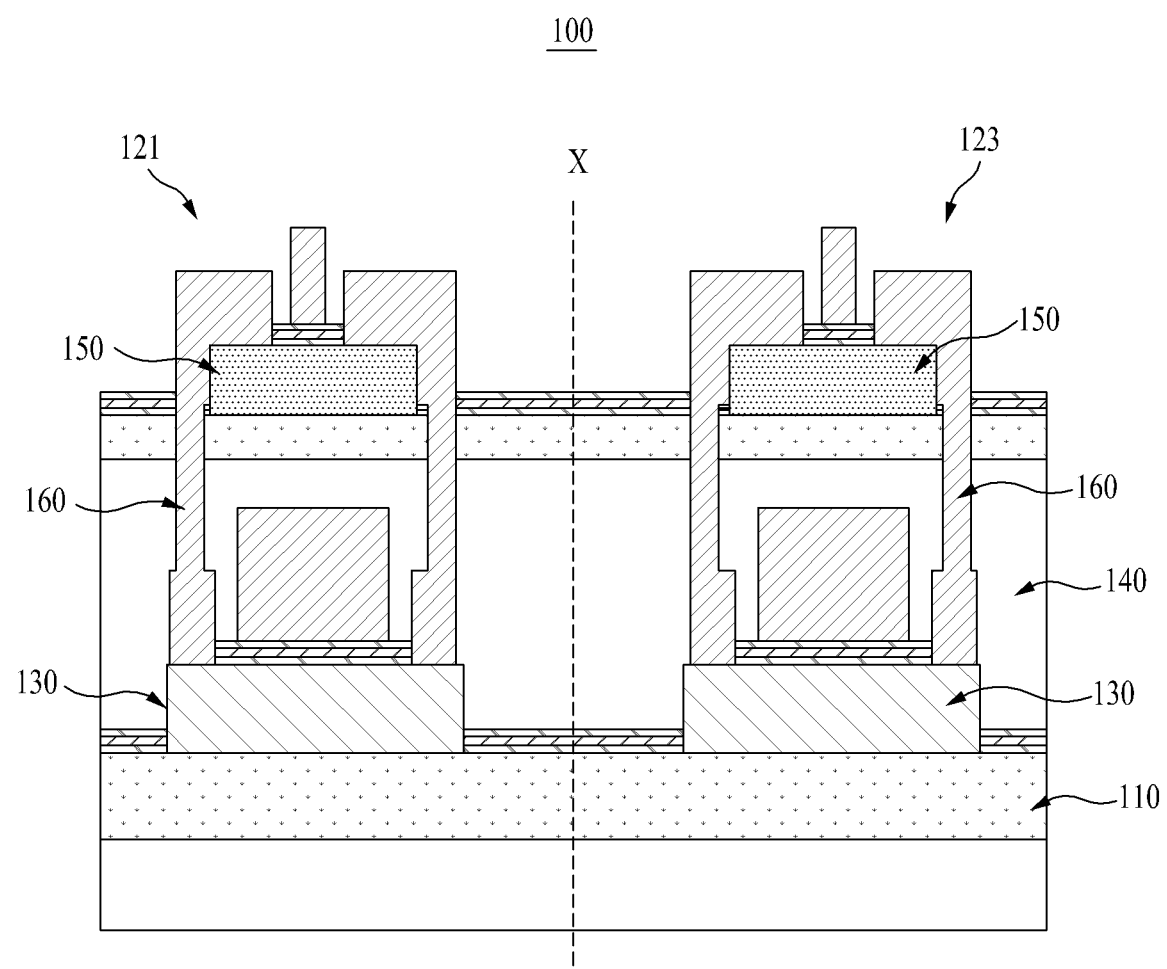
FIG. 1 is a drawing illustrating a device according to a first embodiment.

FIG. 1 is a drawing illustrating a device 100 according to a first embodiment.

Referring to FIG. 1, the device 100 according to the first embodiment relates to an ANN (Artificial Neural Network), and may have a stackable 3D structure. Such device 100 may be used for machine learning. According to the first embodiment, the device 100 may include a substrate 110, and a neuron block 121 and a synapse block 123 connected with at least one coupling element (not shown).

The substrate 110 may support the neuron block 121 and the synapse block 123. The neuron block 121 and the synapse block 123 may be stacked on the substrate 110. Here, one axis X may be defined in a direction perpendicular to one surface of the substrate 110. In other words, the neuron block 121 and the synapse block 123 may be stacked on one surface of the substrate 110 along the one axis X.

The neuron block 121 and the synapse block 123 may be functionally and structurally divided from each other on one surface of the substrate 110. At this time, the neuron block 121 and the synapse block 123 may be placed adjacent to each other on one surface of the substrate 110. Also, the neuron block 121 and the synapse block 123 may be electrically connected through at least one coupling element (not shown). The neuron block 121 may have a computing function. Such neuron block 121 may be composed of a plurality of neurons, and each neuron may be configured with basic computing unit. The synapse block 123 is provided for signal transmission for the neuron block 121, and for this, the synapse block 123 may have a memory function. Such synapse block 123 may be composed of a plurality of synapses, and the synapses may connect the neurons in a network form through weighted links. Substantially, the coupling element may electrically connect the neurons and the synapses.

The neuron block 121 and the synapse block 123 may be simultaneously manufactured on one surface of the substrate 110. The neuron block 121 and the synapse block 123 respectively may include at least one first channel element 130, an insulating element 140, at least one second channel element 150, and at least one connecting element 160. At this time, in the neuron block 121 and the synapse block 123, at least one of the number or the arrangement of the first channel element 130, the second channel element 150, and the connecting element 160 may be different, and the number and the arrangement of the first channel element 130, the second channel element 150, and the connecting element 160 may all be the same.

The first channel element 130 may be arranged on one surface of the substrate 110. Here, the first channel element 130 may be placed on one surface of the substrate 110 along the one axis X. The insulating element 140 may be placed on the substrate 110 and the first channel element 130. Here, the insulating element 130 may cover the first channel element 130 on one surface of the substrate 110 along the one axis X. The second channel element 150 may be arranged on the insulating element 140. Here, the second channel element 150 may be placed on the first channel element 130 along the one axis X. Here, the second channel element 150 may be placed to be stacked on the first channel element 130 with the insulating element 140 interposed therebetween. The connecting element 160 may electrically connect the first channel element 130 and the second channel element 150. For this, the connecting element 160 may penetrate the insulating element 140.

In other words, the first channel element 130 and the second channel element 150 may be stacked on the substrate 110 in order. Through this, the first channel element 130 and the second channel element 150 may be placed up and down along the one axis X with the insulating element 140 interposed therebetween. In addition, the first channel element 130 and the second channel element 150 may be connected to each other through the connecting element 160. For example, one of the first channel element 130 or the second channel element 150 may be a transistor of channel N, and another of the first channel element 130 or the second channel element 150 may be a transistor of channel P. As one example, one of the first channel element 130 or the second channel element 150 may be N type FET (Field Effect Transistor), and another of the first channel element 130 or the second channel element 150 may be P type FET.

FIGS. 2, 3, 4, 5, 6, 7, 8, 9, 10, 11, and 12 are drawings illustrating a manufacturing method of the device 100 according to the first embodiment.

Referring to FIGS. 2, 3, 4, 5, 6, 7, 8, 9, 10, 11, and 12, the device 100 according to the first embodiment may be manufactured. In other words, the device 100 may be manufactured in a stackable 3D structure. At this time, on the single substrate 110, the neuron block 121 and the synapse block 123 may be simultaneously manufactured. However, the neuron block 121 and the synapse block 123 may be manufactured to be functionally and structurally divided from each other on one surface of the substrate 110.

First, as shown in FIGS. 2, 3, 4, and 5, the first channel elements 130 for the neuron block 121 and the synapse block 123 may be formed on the substrate 110. Each first channel element 130 may include a first active unit 132, a first insulating layer 133, and first electrodes 135, 136, 137. At this time, the first electrodes 135, 136, 137 may include a first G (Gate) electrode 135, a first S (Source) electrode 136, and a first D (Drain) electrode 137.

Figure 2:
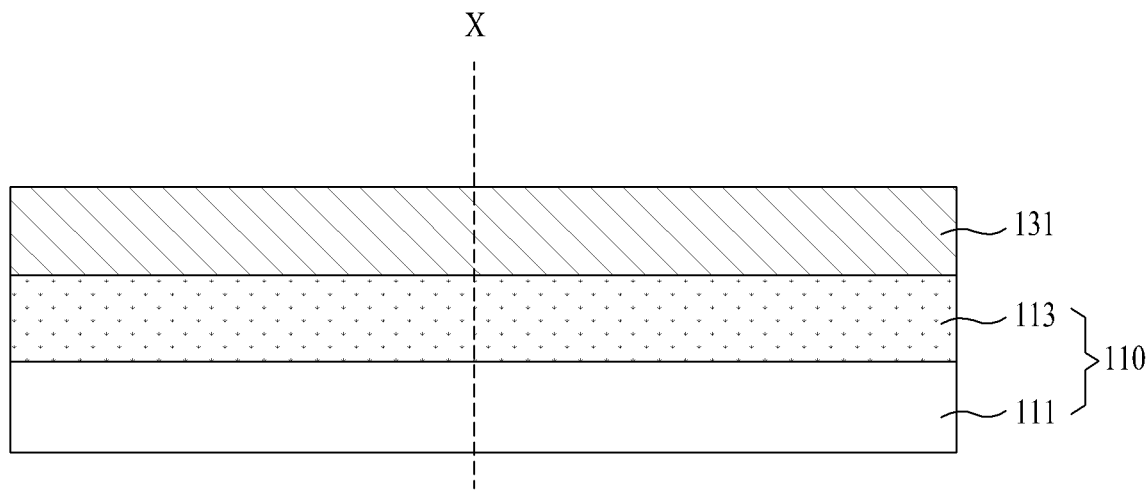
FIGS. 2, 3, 4, 5, 6, 7, 8, 9, 10, 11, and 12 are drawings illustrating a manufacturing method of a device according to a first embodiment.
Figure 3:
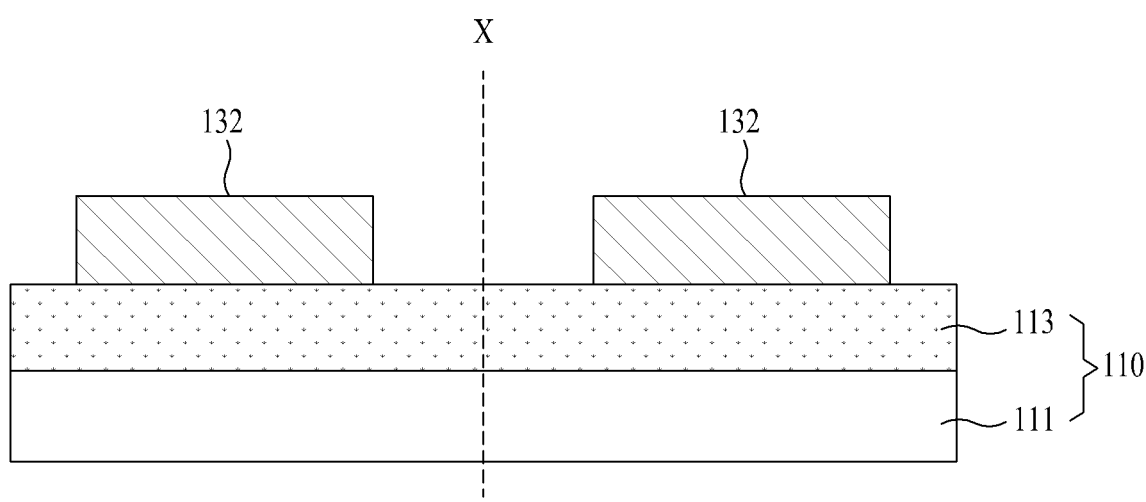

As shown in FIG. 2, the first active layer 131 may be formed on one surface of the substrate 110. After the substrate 110 is prepared, the first active layer 131 may be formed on one surface of the substrate 110. For example, the substrate 110 may include a base substrate 111 and a first oxide film 113 formed on the base substrate 111. In other words, as the first oxide film 113 is formed on the base substrate 111 in a deposition method, the substrate 110 may be prepared. After this, the first active layer 131 may be formed on the first oxide film 113. For example, the first active layer 131 may include at least one of Si (Silicon), TMD (Transition Metal Dichalcogenide), InGaAs (Indium Gallium Arsenide), or Ge (Germanium). Next, as shown in FIG. 3, the first active layer 131 may be divided into a plurality of first active units 132. At this time, the first active units 132 may be separated from each other on one surface of the substrate 110. Here, in the first oxide film 113, surrounding areas of each of the first active units 132 may be exposed.

Figure 4:
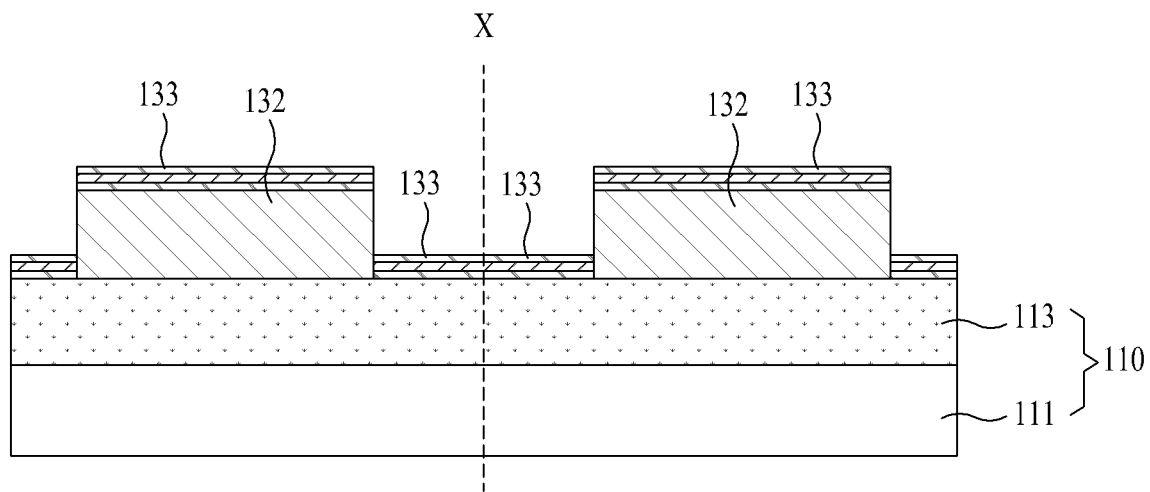

Then, as shown in FIG. 4, the first insulating layer 133 may be formed on the first active units 132. In other words, the first insulating layer 133 may be placed on one surface of the first active units 132. At this time, the first insulating layer 133 may be further formed on the surrounding areas of each of the first active units 132 in the first oxide film 113. Here, the first insulating layer 133 may be formed of the same material for all of the first active units 132. For example, the first insulating layer 133 may be formed of one material or a combination of at least two materials.

Figure 5:
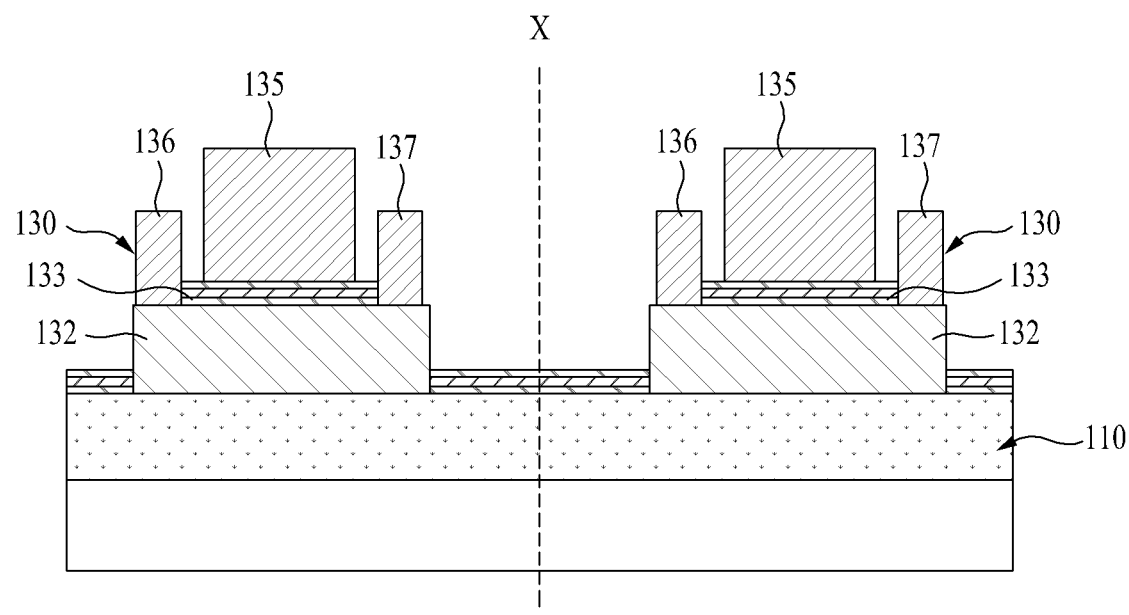

Next, as shown in FIG. 5, the first electrodes 135, 136, 137 may be formed for the first active units 132. For this, part of the first insulating layer 133 may be removed on one surface of the first active units 132. After this, for each of the first active units 132, the first G electrode 135, the first S electrode 136, and the first D electrode may be processed. The first G electrode 135 may be placed on the opposite side of the first active unit 132 with the first insulating layer 133 interposed therebetween. In other words, the first G electrode 135 may not contact the first active unit 132. The first S electrode 136 may be placed on one side of the first active unit 132. In other words, the first S electrode 136 may contact one side of the first active unit 132, and may not contact the first G electrode 135 by being separated from the first G electrode 135. The first D electrode 137 may placed on the other side of the first active unit 132. In other words, the first D electrode 137 may contact the other side of the first active unit 132, and may not contact the first G electrode 135 by being separated from the G electrode 135. Also, the first active unit 132 may connect the first S electrode 136 and the first D electrode 137 between the first S electrode 136 and the D electrode 137.

Figure 6:
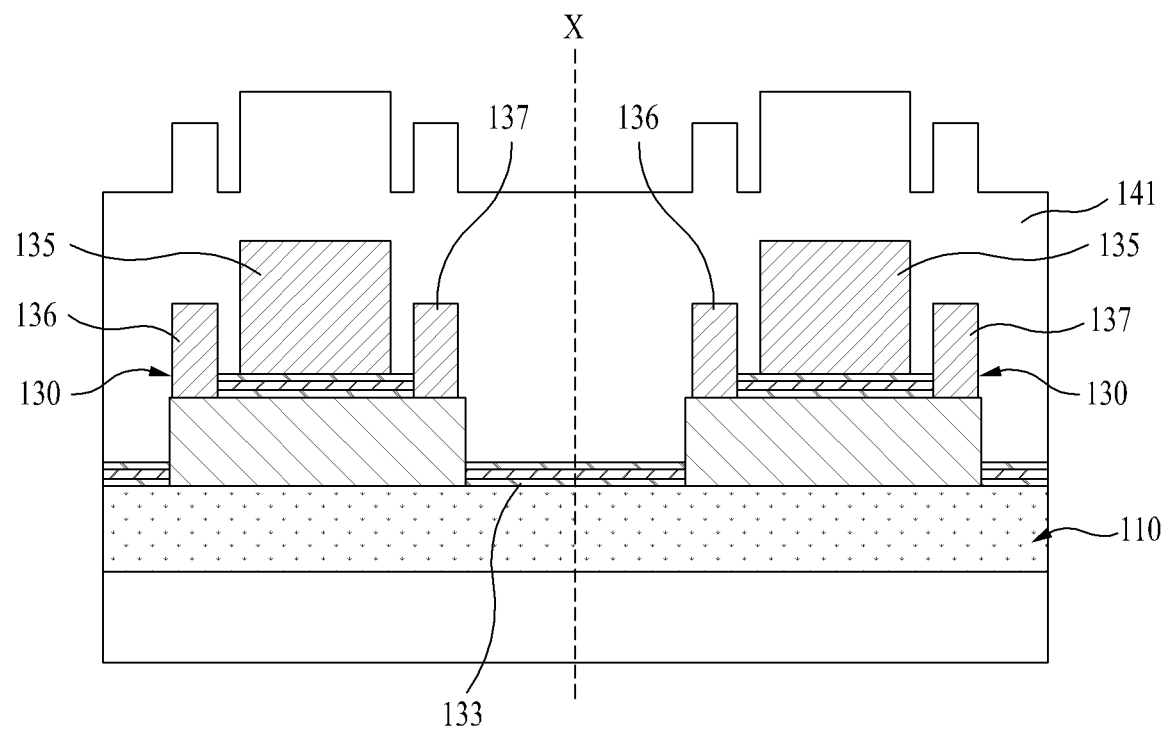
Figure 7:
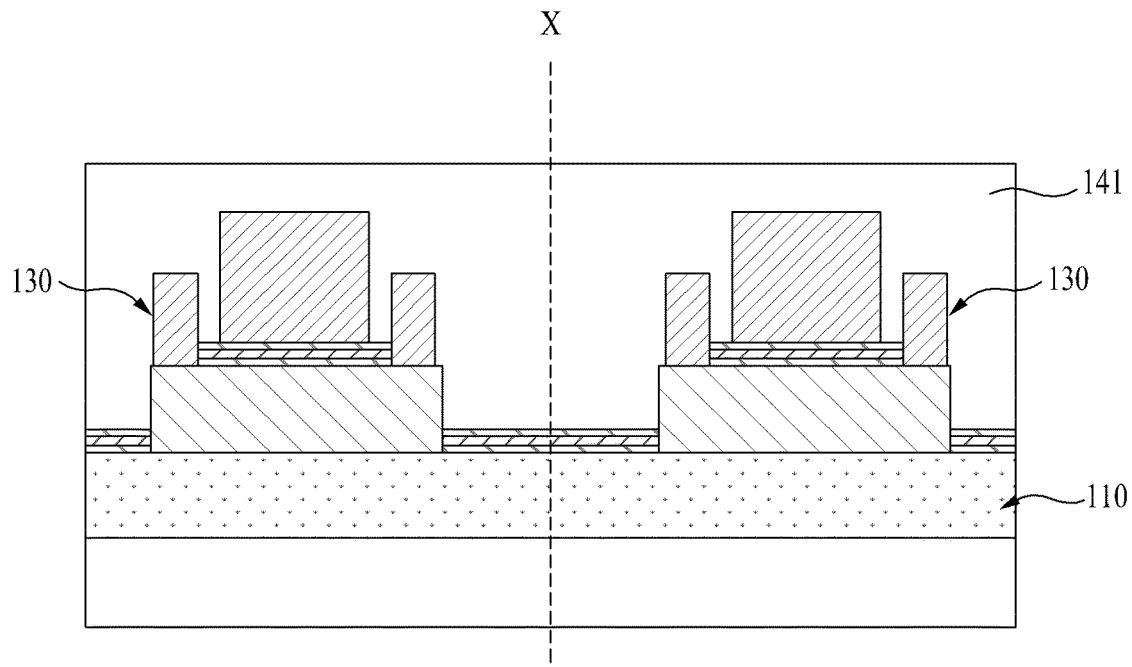
Figure 8:
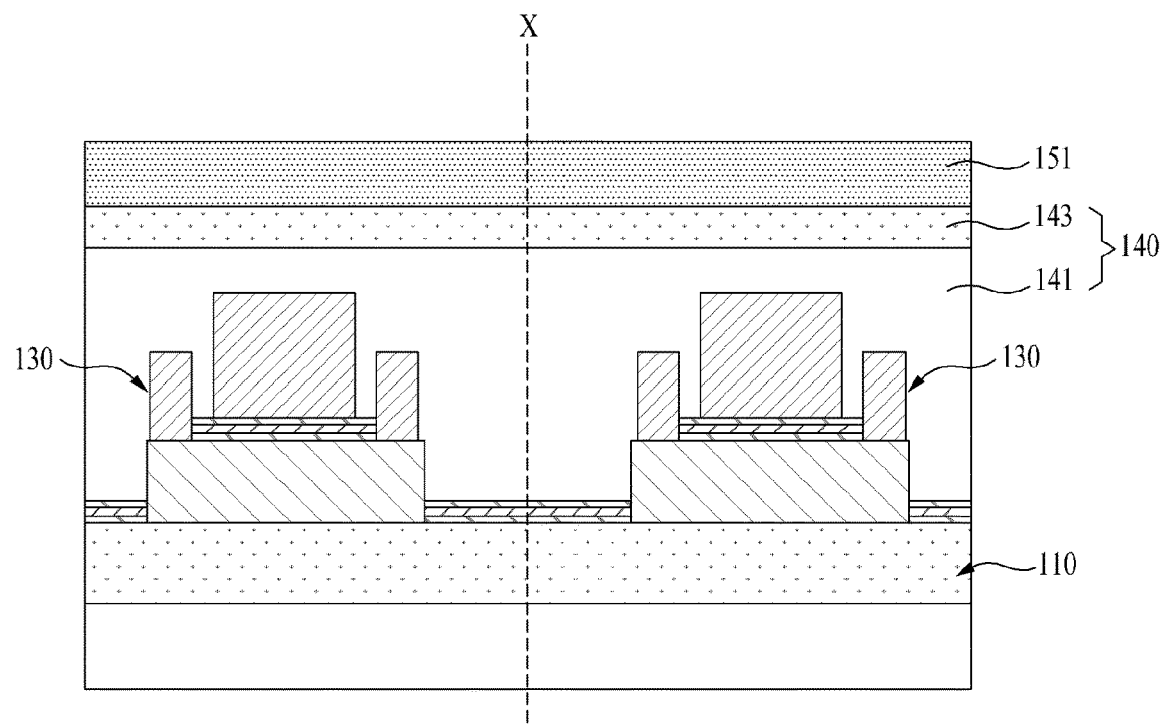

Then, as shown in FIGS. 6, 7, and 8, throughout the neuron block 121 and the synapse block 123, the insulating element 140 may be formed on the first channel elements 130. The insulating element 140 may include an insulating member 141 and a second oxide film 143.

As shown in FIGS. 6 and 7, the insulating member 141 may be formed to cover the first elements 130 on the substrate 110. For example, the insulating member 141 may be formed of the same material with the base substrate 111. At this time, as shown in FIG. 6, the insulating member 141 may be formed in a deposition method. After this, as shown in FIG. 7, the insulating member 141 may be flattened through CMP (Chemical Mechanical Polishing). Through this, on the first channel elements 130, one surface of the insulating member 141 may be provided.

Next, as shown in FIG. 8, the second oxide film 143 may be formed on one surface of the insulating member 141 in the deposition method. For example, the second oxide film 143 may be formed of the same material with the first oxide film 113.

Subsequently, as shown in FIGS. 8, 9, 10, and 11, the second channel elements 150 for the neuron block 121 and the synapse block 123 may be formed on the insulating element 140. At this time, the second channel elements 150 may be formed to be respectively stacked on the first channel elements 130 with the insulating element 140 interposed therebetween. Each second channel element 150 may include a second active unit 152, a second insulating layer 153, and second electrodes 155, 156, 157. At this time, the second electrodes 155, 156, 157 may include a second G electrode 155, a second S electrode 156, and a second D electrode 157.

As shown in FIG. 8, the second active layer 151 may be formed on one surface of the insulating element 140. At this time, the second active layer 151 may be formed on the second oxide film 143. For example, the second active layer 151 may include at least one of Si (Silicon), TMD (Transition Metal Dichalcogenide), InGaAs (Indium Gallium Arsenide), or Ge (Germanium).

Figure 9:
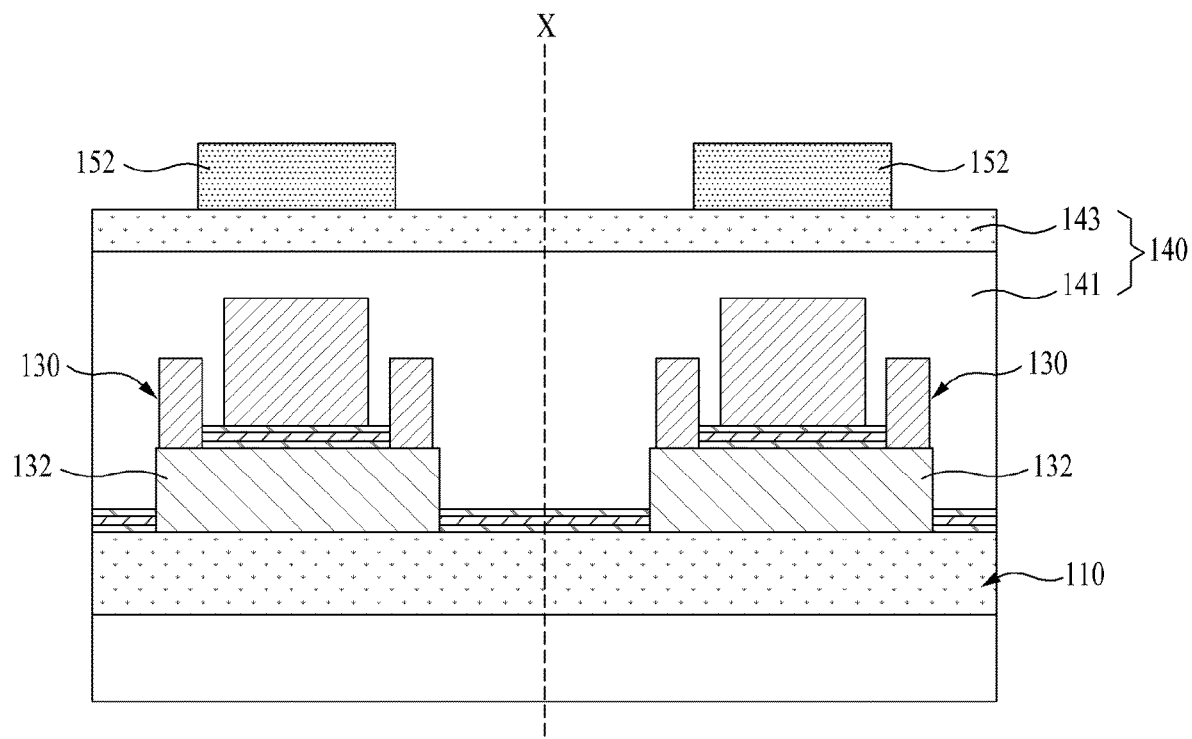

Next, as shown in FIG. 9, the second active layer 151 may be divided into a plurality of second active units 152. At this time, the second active units 152 may be separated from each other on the one surface of the insulating element 140. Here, in the second oxide film 143, surrounding areas of each of the second active units 152 may be exposed.

Figure 10:
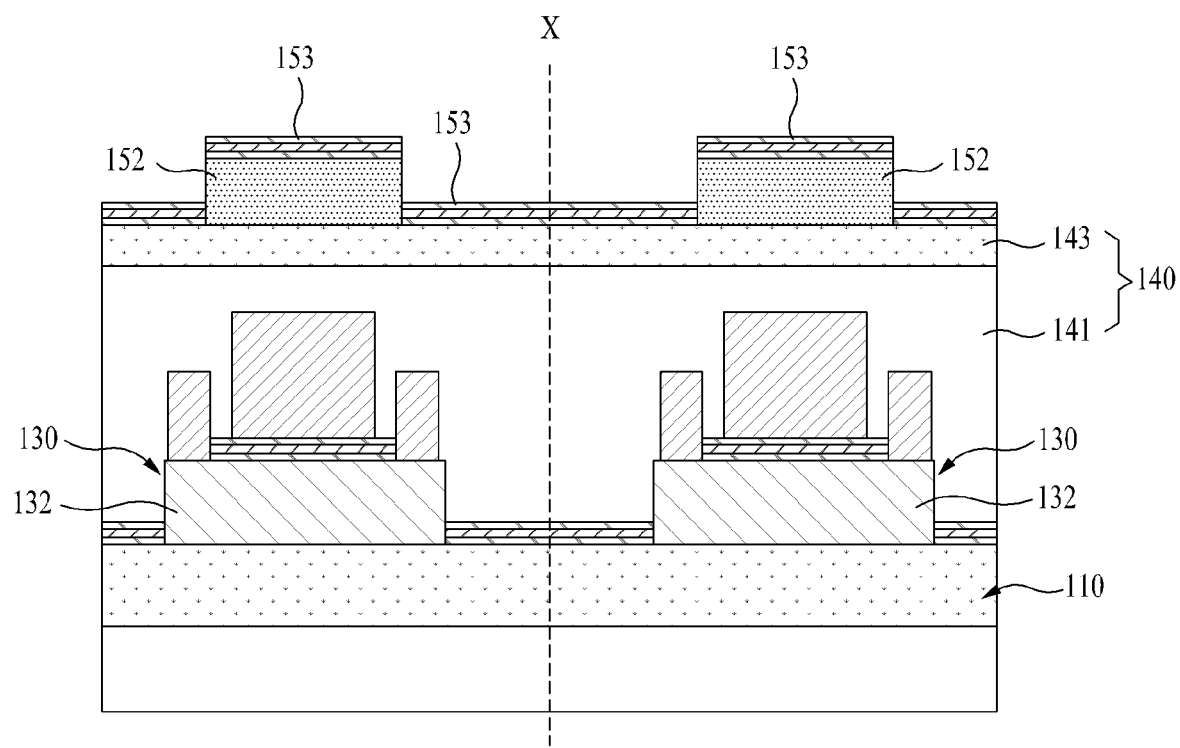

Then, as shown in FIG. 10, the second insulating layer 153 may be formed on the second active units 152. In other words, the second insulating layer 153 may be formed on one surface of the second active units 153 in the deposition method. At this time, the second insulating layer 153 may be further formed on the surrounding areas of each of the second active units 152 in the second oxide film 143. Here, the second insulating layer 153 may be formed of the same material with all of the second active units 152. For example, the second insulating layer 153 may be formed of one material or a combination of at least two materials.

Figure 11:
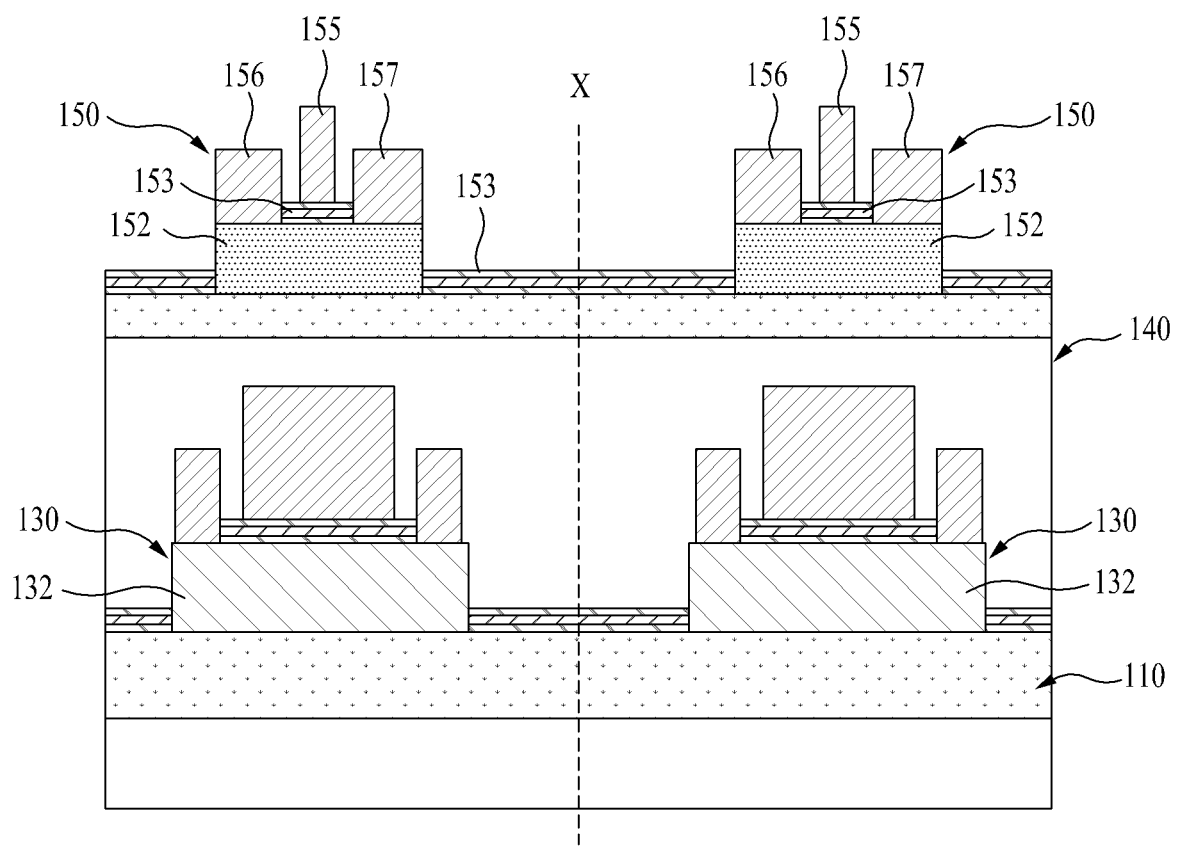

Next, as shown in FIG. 11, the second electrodes 155, 156, 157 may be formed for the second active units 152. For this, part of the second insulating layer 153 may be removed on one surface of the second active units 152. After this, for each of the second active units 152, the second G electrode 155, the second S electrode 156, and the second D electrode 157 may be processed. The second G electrode 155 may be placed on the opposite side of the second active unit 152 with the second insulating layer 153 interposed therebetween. In other words, the second G electrode 155 may not contact the second active unit 152. The second S electrode 156 may be placed on one side of the second active unit 152. In other words, the second S electrode 156 may contact one side of the second active unit 152, and may not contact the second G electrode 155 by being separated from the second G electrode 155. The second D electrode 157 may be placed on the other side of the second active unit 152. In other words, the second D electrode 157 may contact the other side of the second active unit 152, and may not contact the second G electrode 155 by being separated from the second G electrode 155. In addition, the second active unit 152 may connect the second S electrode 156 and the second D electrode 157 between the second S electrode 156 and the second D electrode 157.

Figure 12:
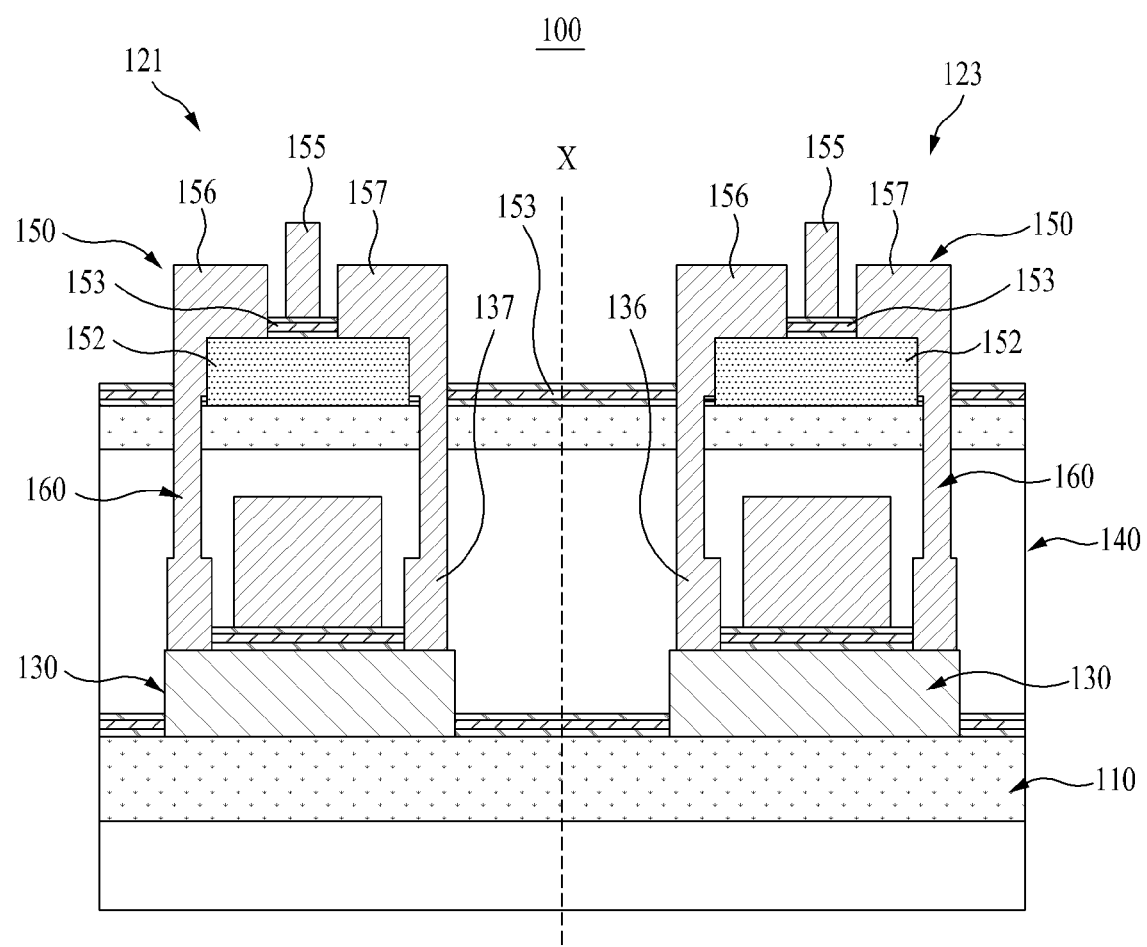

Lastly, as shown in FIG. 12, the connecting elements 160 may be formed to connect the first channel elements 130 and the second channel elements 150. For this, the connecting elements 160 may penetrate the insulating element 140. At this time, the connecting elements 160 may connect the first S electrode 136 and the second S electrode 156, and connect the first D electrode 137 and the second D electrode 157. Through this, the neuron block 121 and the synapse block 123 may be stacked on the substrate 110. After this, although it is not shown, at least one coupling element (not shown) may be formed to connect the neuron block 121 and the synapse block 123. Accordingly, the device 100 according to the first embodiment is manufactured.

Figure 13:
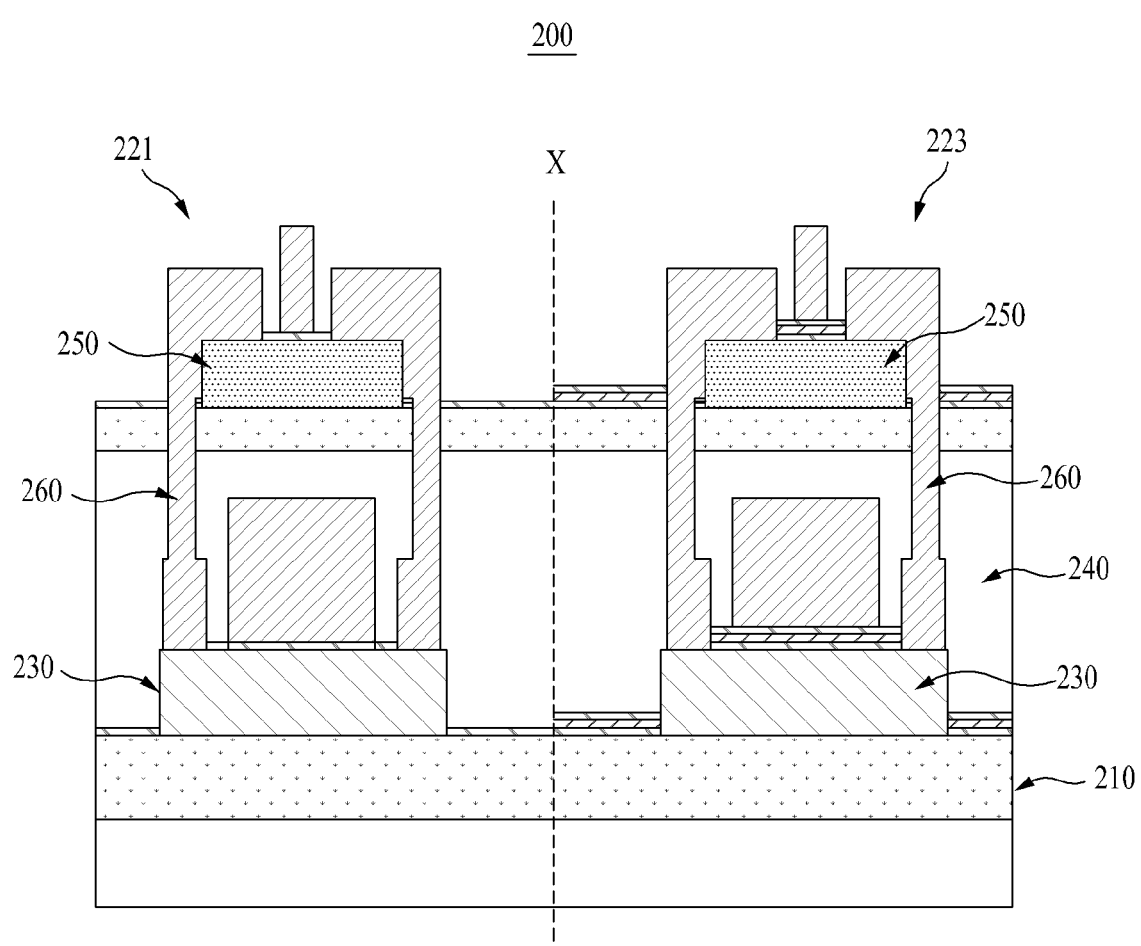
FIG. 13 is a drawing illustrating a device according to a second embodiment.

FIG. 13 is a drawing illustrating a device 200 according to a second embodiment.

Referring to FIG. 13, the device 200 according to the second embodiment relates to an ANN device, and may have a stackable 3D structure. Such device 200 may be used for machine learning. According to the second embodiment, the device 200 may include a substrate 210, a neuron block 221, and a synapse block 223. At this time, since components of the device 200 according to the second embodiment are similar to each of corresponding components of the device 100 according to the first embodiment, the detailed description will be omitted.

However, according to the second embodiment, during the neuron block 121 and the synapse block 123 are simultaneously manufactured on one surface of the substrate 110, some components may be differently manufactured for the neuron block 221 and the synapse block 223. The neuron block 221 and the synapse block 223 may respectively include at least one first channel element 230, an insulating element 240, at least one second channel element 250, and at least one connecting element 260. At this time, at least one of the first channel element 230 or the second channel element 250 may be differently formed for the neuron block 221 and the synapse block 223.

FIGS. 14, 15, 16, 17, 18, 19, 20, 21, 22, 23, 24, 25, and 26 are drawings illustrating a manufacturing method of the device 200 according to the second embodiment.

Referring to FIGS. 14, 15, 16, 17, 18, 19, 20, 21, 22, 23, 24, 25, and 26, the device 200 according to the second embodiment may be manufactured. In other words, the device 200 may be manufactured in a stackable 3D structure. At this time, on the single substrate 210, the neuron block 221 and the synapse block 223 may be simultaneously manufactured. However, the neuron block 221 and the synapse block 223 may be manufactured to be functionally and structurally divided from each other on one surface of the substrate 210.

As shown in FIGS. 14, 15, 16, 17, and 18, the first channel elements 230 for the neuron block 221 and the synapse block 223 may be formed on the substrate 210. Each of the first channel elements 230 may include a first active unit 232, a first insulating layer 233, and first electrodes 235, 236, 237. At this time, the first electrodes 235, 236, 237 may include a first G (Gate) electrode 235, a first S (Source) electrode 236, and a first D (Drain) electrode 237.

Figure 14:
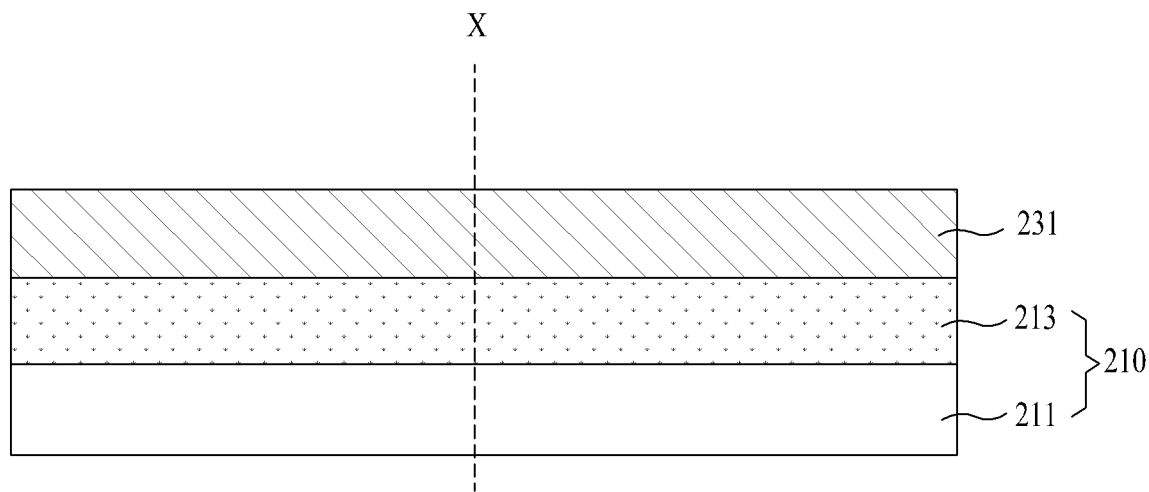
FIGS. 14, 15, 16, 17, 18, 19, 20, 21, 22, 23, 24, 25, and 26 are drawings illustrating a manufacturing method of a device according to a second embodiment.

As shown in FIG. 14, a first active layer 231 may be formed on one side of the substrate 210. After the substrate 210 is prepared, the first active layer 231 may be formed on one surface of the substrate 210. For example, the substrate 210 may include a base substrate 211 and a first oxide film 213 formed on the base substrate 211. In other words, as the first oxide film 213 is formed on the base substrate 211 in a deposition method, the substrate 210 may be prepared. After this, the first active layer 231 may be formed on the first oxide film 213. For example, the first active layer 231 may include at least one of Si (Silicon), TMD (Transition Metal Dichalcogenide), InGaAs (Indium Gallium Arsenide), or Ge (Germanium).

Figure 15:
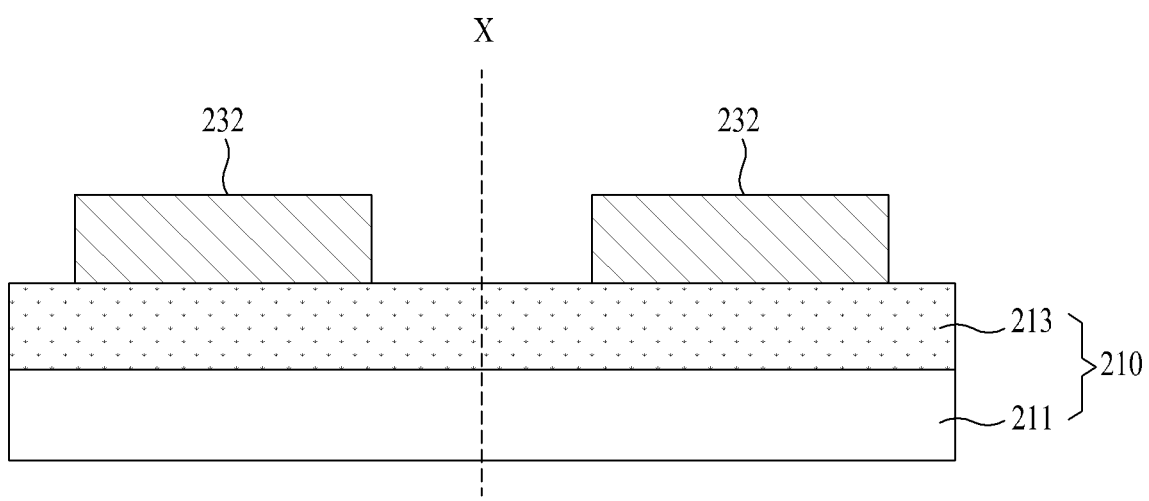

Next, as shown in FIG. 15, the first active layer 231 may be divided into a plurality of the first active units 232. At this time, the first active units 232 may be separated from each other on one surface of the substrate 210. Here, in the first oxide film 213, surrounding areas of each of the first active units 232 may be exposed.

Figure 16:
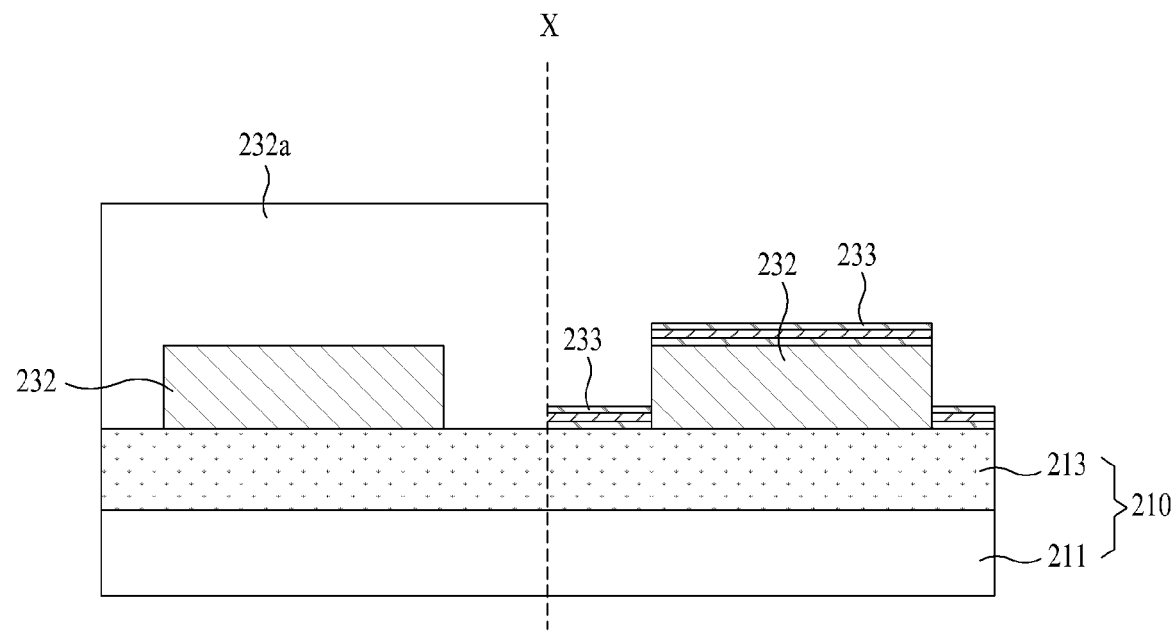
Figure 17:
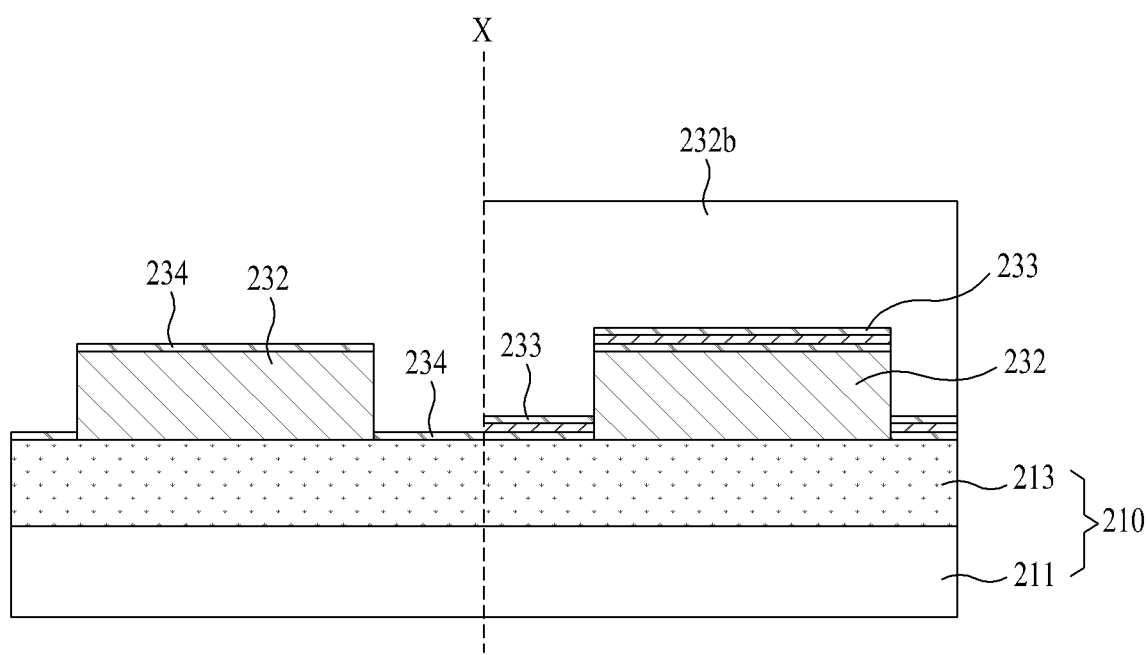

Next, as shown in FIGS. 16 and 17, the first insulating layer 233, 234 may be formed on the first active units 232. In other words, the first insulating layer 233, 234 may be placed on one surface of the first active units 232. At this time, the first insulating layer 233, 234 may be further formed on the surrounding areas of each of the first active units 232, in the first oxide film 213. Here, the first insulating layer 234 for the neuron block 221 and the first insulating layer 233 for the synapse block 223 may be individually formed, and may be formed of different materials. For example, the first insulating layer 233, 234 may be formed of one material or a combination of at least two materials. As an example, at least one of the first insulating layer 234 for the neuron block 221 or the first insulating layer 233 for the synapse block 223 may be formed of a combination of at least two materials.

For example, after the first insulating layer 233 for the synapse block 223 is formed, the first insulating layer 234 for the neuron block 221 may be formed. For this, the first active units 232 may be divided into at least one active unit 232 for the neuron block 221 and the rest of the active unit 232 for the synapse block 223. As shown in FIG. 16, a first mask member 232a may be formed in the first oxide film 213 to cover the at least one active unit 232 and its surrounding area in the first oxide film 213. Also, the first insulating layer 233 for the synapse block 223 may be formed on the rest of the active unit 232 and its surrounding area in the first oxide film 213, and then, the first mask member 232a may be removed. After this, as shown in FIG. 17, a second mask member 232b may be formed to cover the rest of the first active units 232 and the first insulating layer 233 on the first oxide layer 213. In addition, the first insulating layer 234 for the neuron block 221 may be formed on at least one first active unit 232 and its surrounding area in the first oxide film 213, and then, the second mask member 232b may be removed. For example, the first mask member 232a and the second mask member 232b may include at least one of $Si_3N_4$, $SiN_X$, $SiO_2$, $Y_2O_3$, $La_2O_3$, or $TiO_2$.

As another example, after the first insulating layer 234 for the neuron block 221 is formed, the first insulating layer 233 for the synapse block 223 may be formed. This is similar to the above described example, so detailed description will be omitted.

Figure 18:
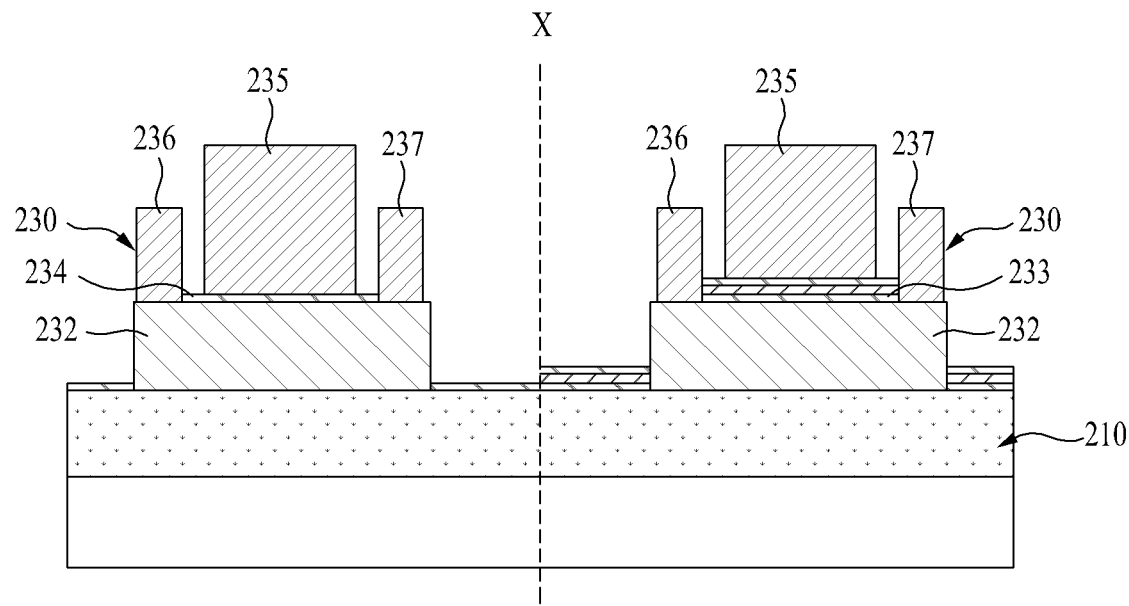

Next, as shown in FIG. 18, the first electrodes 235, 236, 237 may be formed for the first active units 232. For this, part of the first insulating layer 233, 234 may be removed on one surface of the first active units 232. After this, for each of the first active units 232, the first G electrode 235, the first S electrode 236, and the first D electrode 237 may be processed. The first G electrode 235 may be placed on the opposite side of the first active unit 232 with the first insulating layer 233, 234 interposed therebetween. In other words, the first G electrode 235 may not contact the first active unit 232. The first S electrode 236 may be placed on one side of the first active unit 232. In other words, the first S electrode 236 may contact one side of the first active unit 232, and may not contact the first G electrode 235 by being separated from the first G electrode 235. The first D electrode 237 may be placed on the other side of the first active unit 232. In other words, the first D electrode 237 may contact the other side of the first active unit 232, and may not contact the first G electrode 235 by being separated from the first G electrode 235. Also, the first active unit 232 may connect the first S electrode 236 and the first D electrode 237 between the first S electrode 236 and the first D electrode 237.

Figure 19:
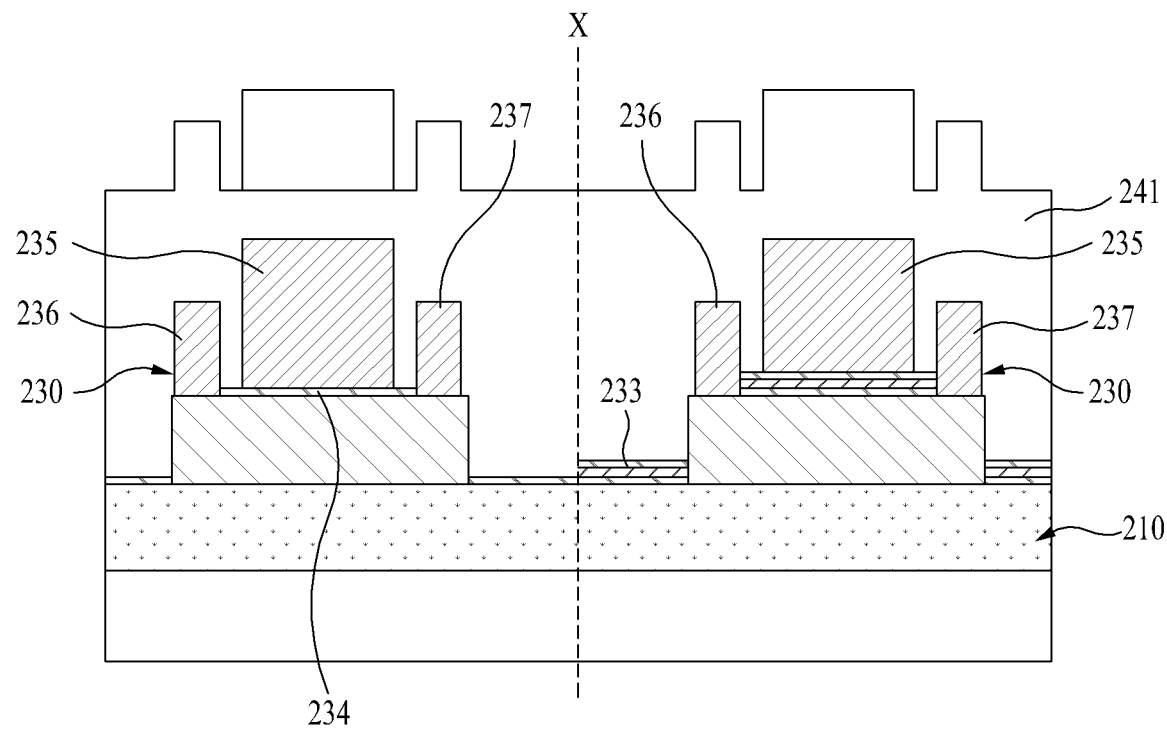
Figure 20:
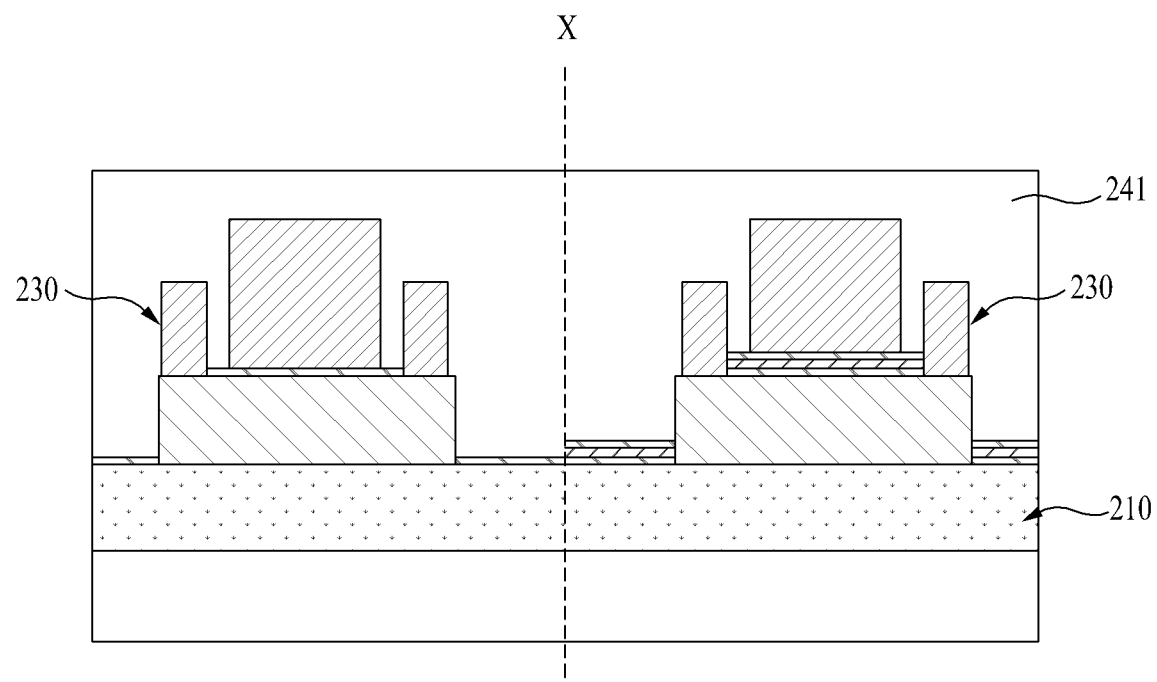
Figure 21:
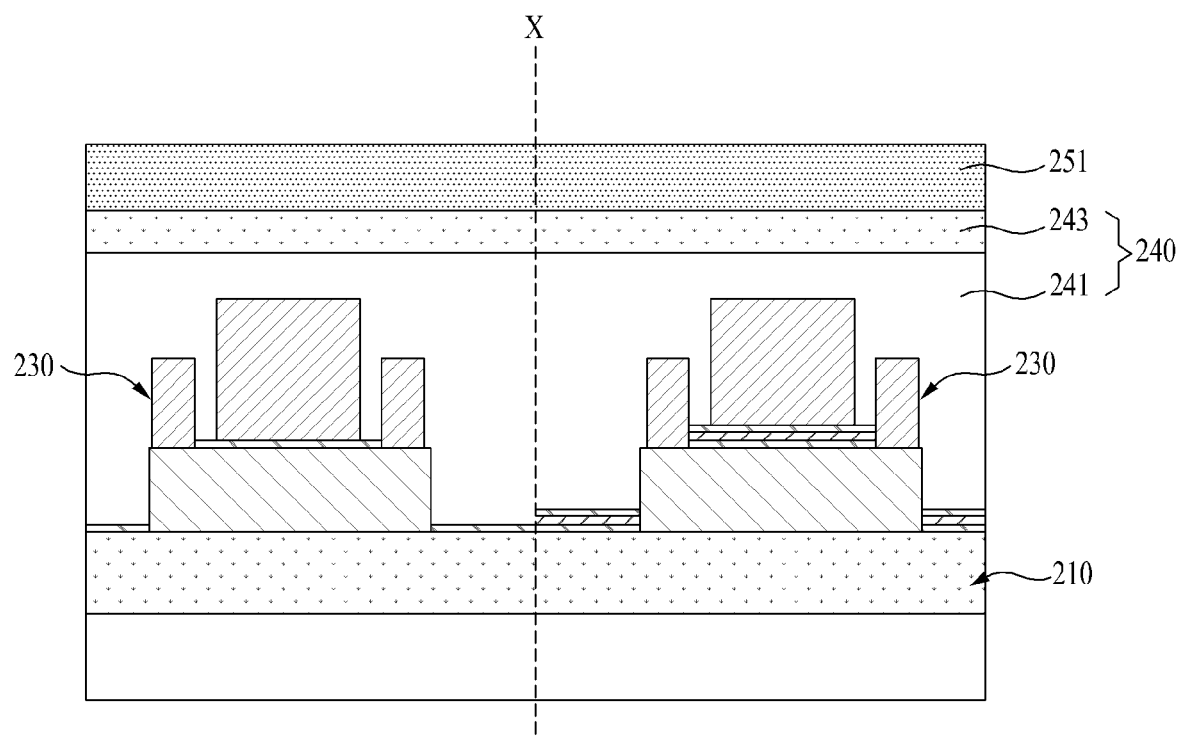

Then, as shown in FIGS. 19, 20, and 21, throughout the neuron block 221 and the synapse block 223, the insulating element 240 may be formed on the substrate 210 and the first channel elements 230. The insulating element 240 may include an insulating member 241 and a second oxide film 243.

As shown in FIGS. 19 and 20, the insulating member 241 may be formed to cover the first channel elements 230 on the substrate 210. For example, the insulating member 241 may be formed of the same material with the base substrate 211. At this time, as shown in FIG. 19, the insulating member 241 may be formed in a deposition method. After this, as shown in FIG. 20, the insulating member 241 may be flattened through CMP (Chemical Mechanical Polishing). Through this, on the first channel elements 230, one surface of the insulating member 241 may be provided. Next, as shown in FIG. 21, the second oxide film 243 may be formed on one surface of the insulating member 241 in the deposition method. For example, the second oxide film 243 may be formed of the same material with the first oxide film 213.

Then, as shown in FIGS. 21, 22, 23, 24, and 25, the second channel elements 250 for the neuron block 221 and synapse block 223 may be formed on the insulating element 240. At this time, the second channel elements 250 may be formed to be respectively stacked on the first channel elements 230 with the insulating element 240 interposed therebetween. Each second channel element 250 may include a second active unit 252, second insulating layer 253, 254, and second electrodes 255, 256, 257. At this time, the second electrodes 255, 256, 257 may include a second G electrode 255, a second S electrode 256, and a second D electrode 257.

As shown in FIG. 21, the second active layer 251 may be formed on one surface of the insulating element 240. At this time, the second active layer 251 may be formed on the second oxide film 243. For example, the second active layer 251 may include at least one of Si (Silicon), TMD (Transition Metal Dichalcogenide), InGaAs (Indium Gallium Arsenide), or Ge (Germanium).

Figure 22:
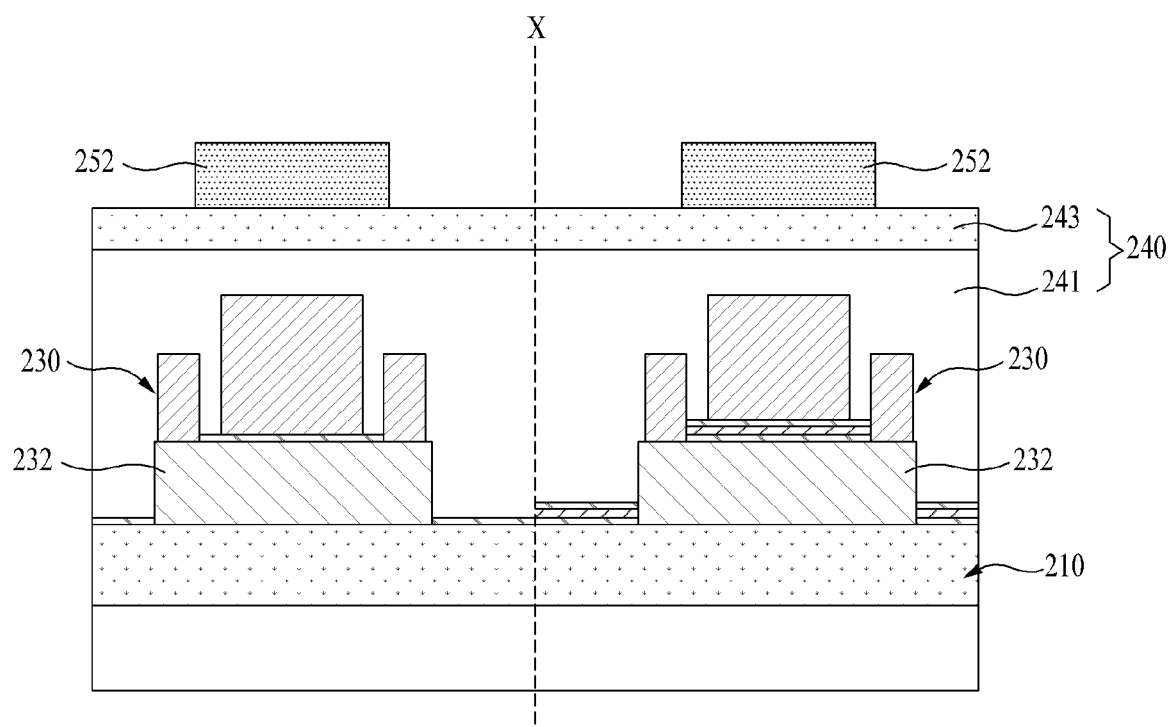

Next, as shown in FIG. 22, the second active layer 251 may be divided into a plurality of second active units 252. At this time, the second active units 252 may be separated from each other on one surface of the insulating element 240. Here, on the second oxide film 243, surrounding areas of each of the second active units 252 may be exposed.

Figure 23:
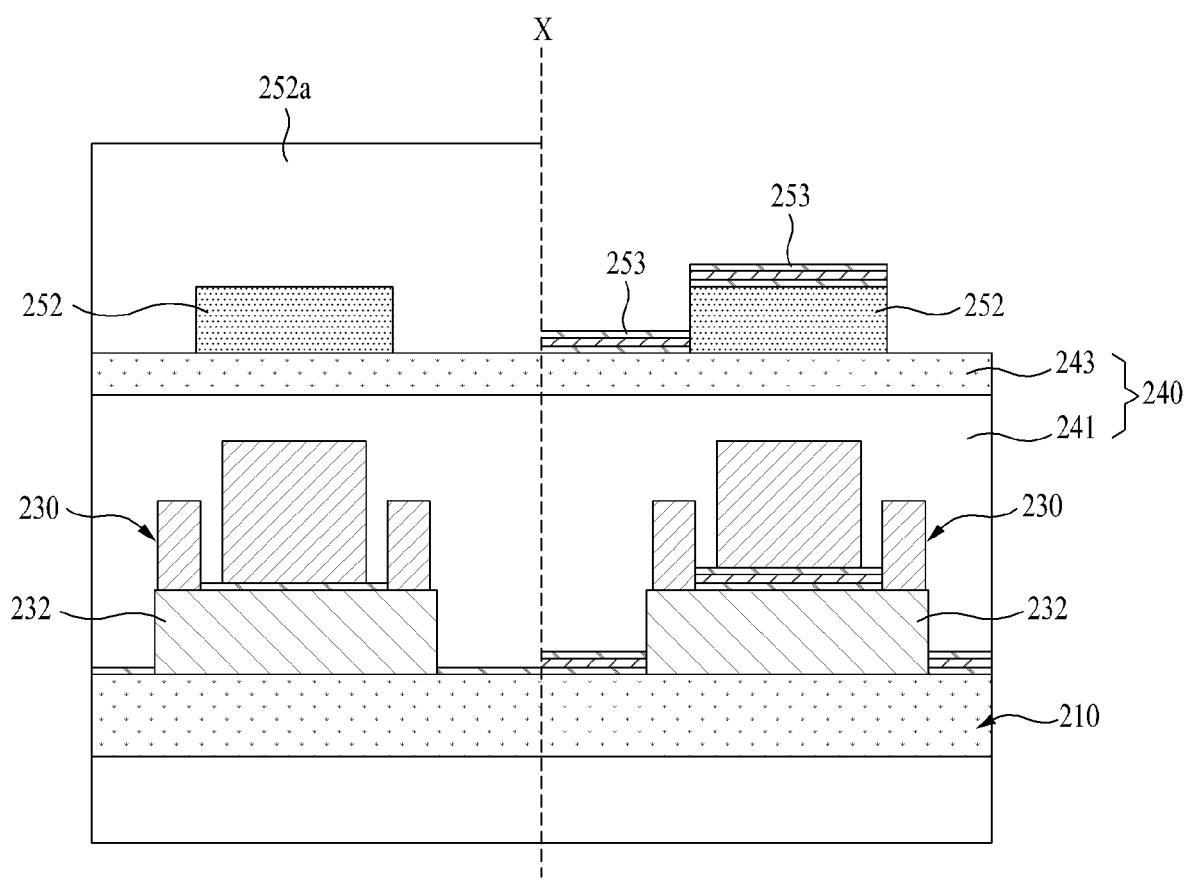
Figure 24:
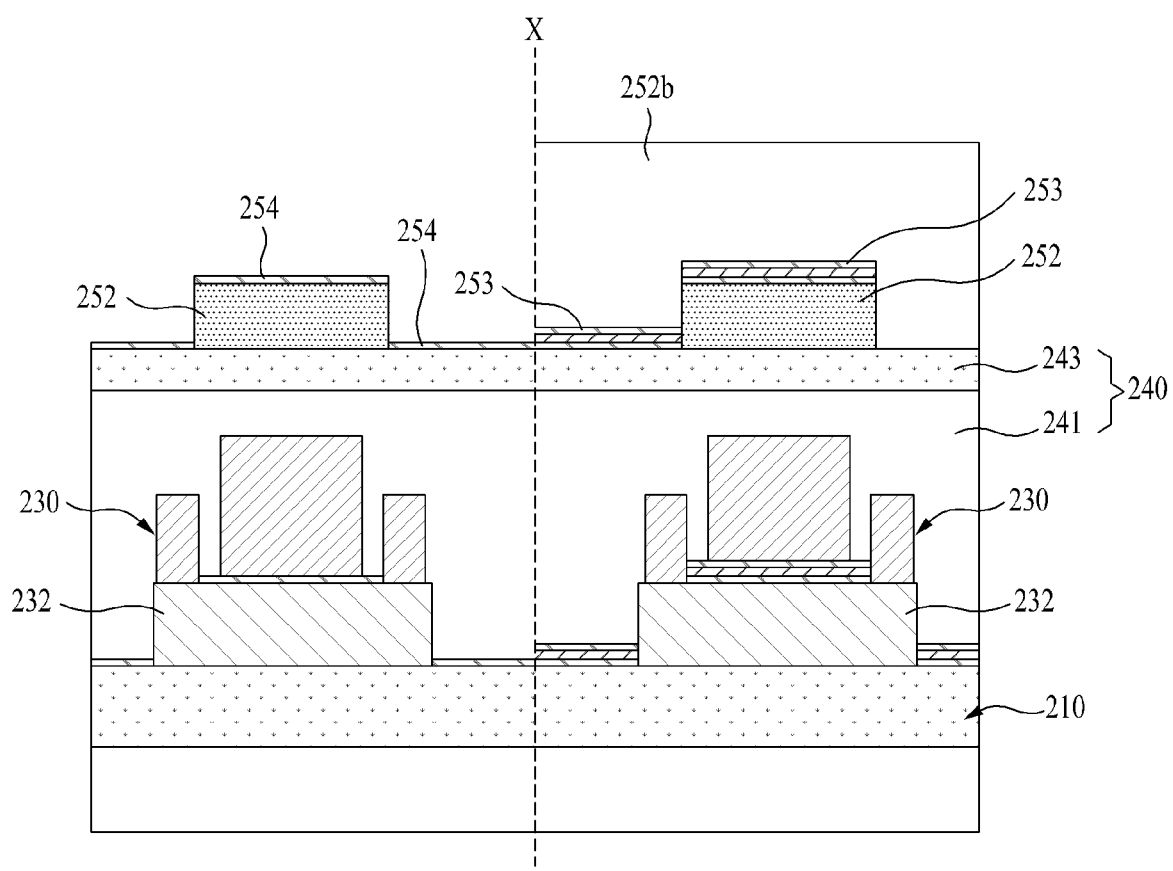

Next, as shown in FIGS. 23 and 24, the second insulating layer 253, 254 may be formed on the second active units 252. In other words, the second insulating layer 253, 254 may be formed on one surface of the second active units 252 in a deposition method. At this time, the second insulating layer 253, 254 may be further formed on the surrounding areas of each of the second active units 252. Here, the second insulating layer 254 for the neuron block 221 and the second insulating layer 253 for the synapse block 223 may be individually formed, and may be formed of different materials. For example, the second insulating layer 253, 254 may be formed of one material or a combination of at least two materials. As an example, at least one of the second insulating layer 254 for the neuron block 221 and the second insulating layer 253 for the synapse block 223 may be formed of a combination of at least two materials.

For example, after the second insulating layer 253 for the synapse block 223 is formed, the second insulating layer 254 for the neuron block 221 may be formed. For this, the second active units 252 may be divided into at least one second active unit 252 for the neuron block 221 and the rest of the second active unit 252 for the synapse block 223. As shown in FIG. 23, a third mask member 252a may be formed in the second oxide film 243 to cover at least one second active unit 252 and its surrounding area in the second oxide film 243. Also, the second insulating layer 253 for the synapse block 223 may be formed on the rest of the second active unit 252 and its surrounding area in the second oxide film 243, and then, the third mask member 252a may be removed. After this, as shown in FIG. 24, a fourth mask member 252b may be formed to cover the rest of the second active units 252 and the second insulating layer 253 in the second oxide film 243. Also, the second insulating layer 254 for the neuron block 221 may be formed on the at least one second active unit 252 and its surrounding area on the second oxide film 243, and then, the fourth mask member 252b may be removed. For example, the third mask member 252a and the fourth mask member 252b may include at least one of Si3N4, SiNX, SiO2, Y2O3, La2O3, or TiO2.

As another example, after the second insulating layer 254 for the neuron block 221 is formed, the second insulating layer 253 for the synapse block 223 may be formed. This is similar to the above described example, so the detailed description will be omitted.

Figure 25:
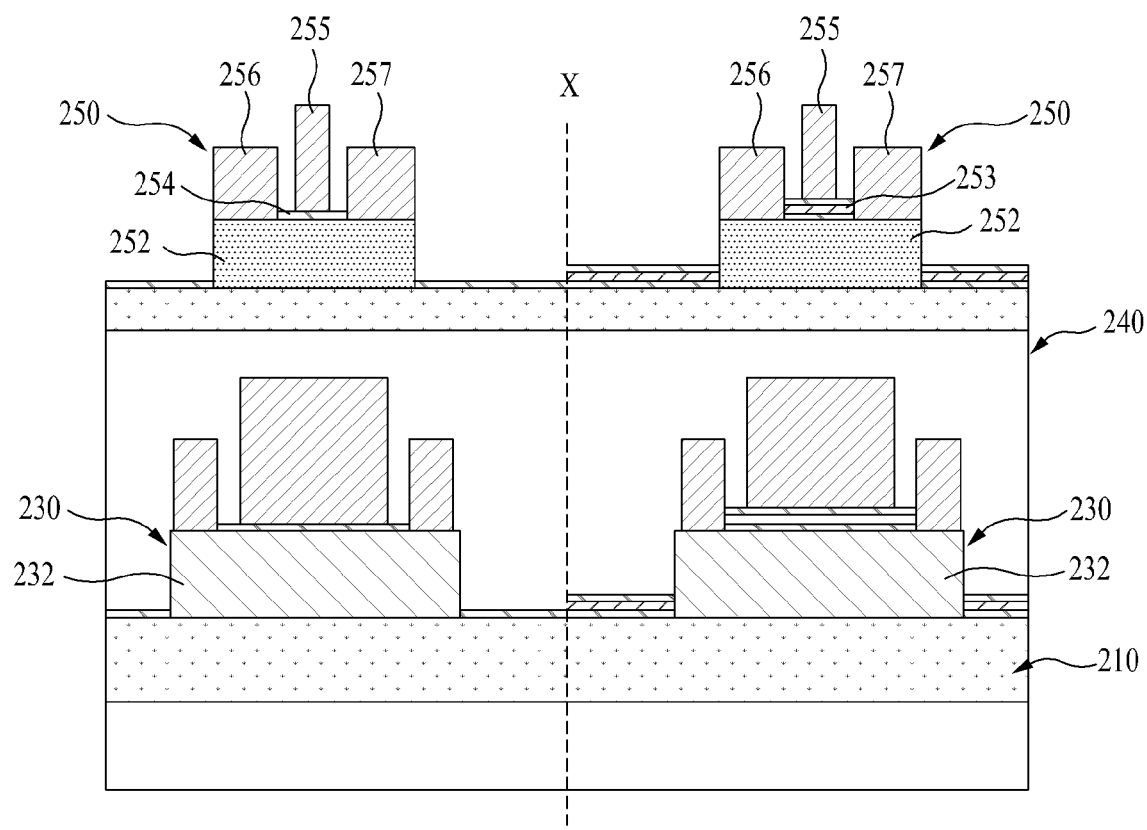

Next, as shown in FIG. 25, the second electrodes 255, 256, 257 may be formed for the second active units 252. For this, part of the second insulating layer 253, 254 may be removed on the one surface of the second active units 252. After this, for each second active unit 252, the second G electrode 255, the second S electrode 256, and the second D electrode 257 may be processed. The second G electrode 255 may be placed on the opposite side of the second active unit 252 with the second insulating layer 253, 254 interposed therebetween. In other words, the second G electrode 255 may not contact the second active unit 252. The second S electrode 256 may be placed on one side of the second active unit 252. In other words, the second S electrode 256 may contact one side of the second active unit 252, and may not contact the second G electrode 255 by being separated from the second G electrode 255. The second D electrode 257 may be placed the other side of the second active unit 252. In other words, the second D electrode 257 may contact the other side of the second active unit 252, and may not contact the second G electrode 255 by being separated from the G electrode 255. Also, the second active unit 252 may connect the second S electrode 256 and the second D electrode 257 between the second S electrode 256 and the second D electrode 257.

Figure 26:
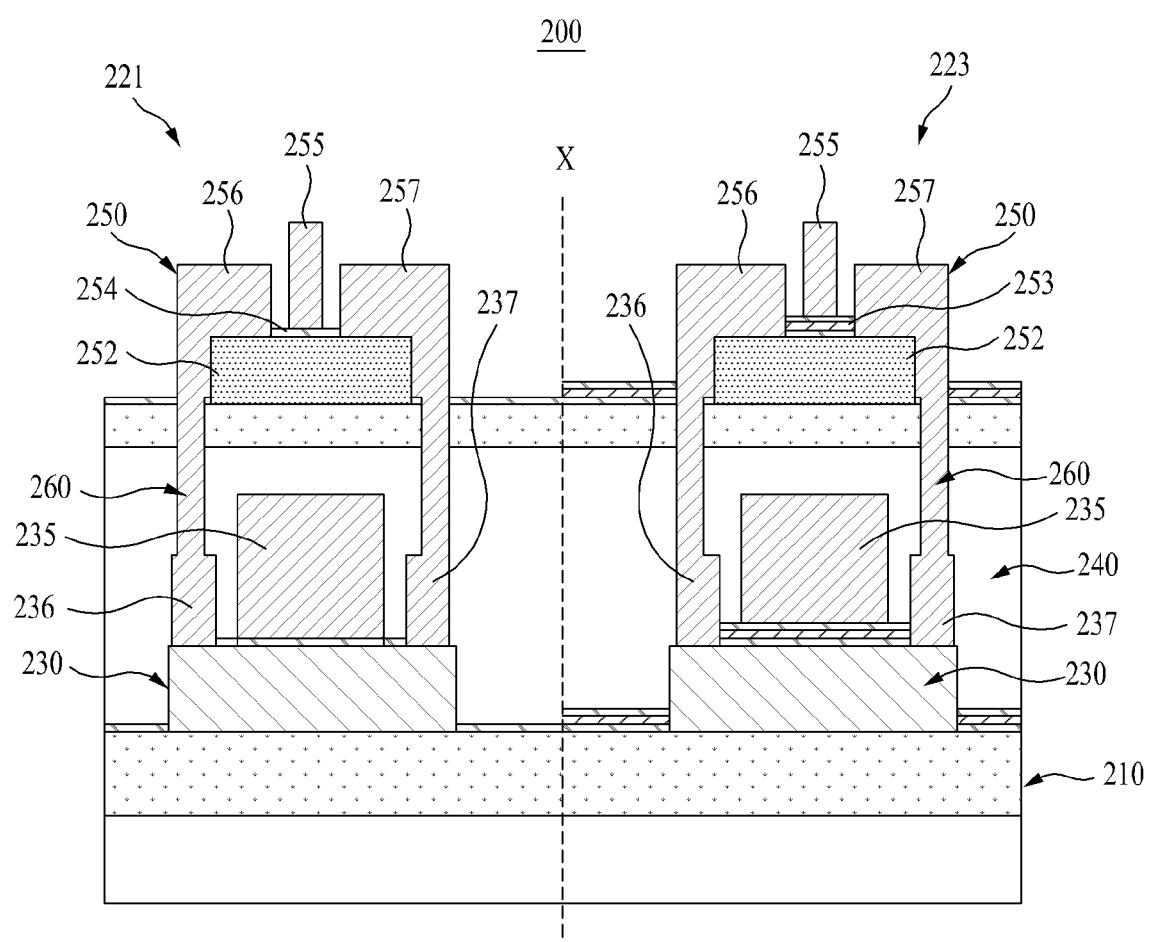

Last, as shown in FIG. 26, the connecting elements 260 may be formed to connect the first channel elements 230 and the second channel elements 250. For this, the connecting elements 260 may penetrate the insulating element 240. At this time, the connecting elements 260 may connect the first S electrode 236 and the second S electrode 256, and connect the first D electrode 237 and the second D electrode 257. Through this, the neuron block 221 and the synapse block 223 may be stacked on the substrate 210. After this, it is not shown, but at least one coupling element (not shown) may be formed to connect the neuron block 221 and the synapse block 223. Accordingly, the device 200 according to the second embodiment is manufactured.

Figure 27A:
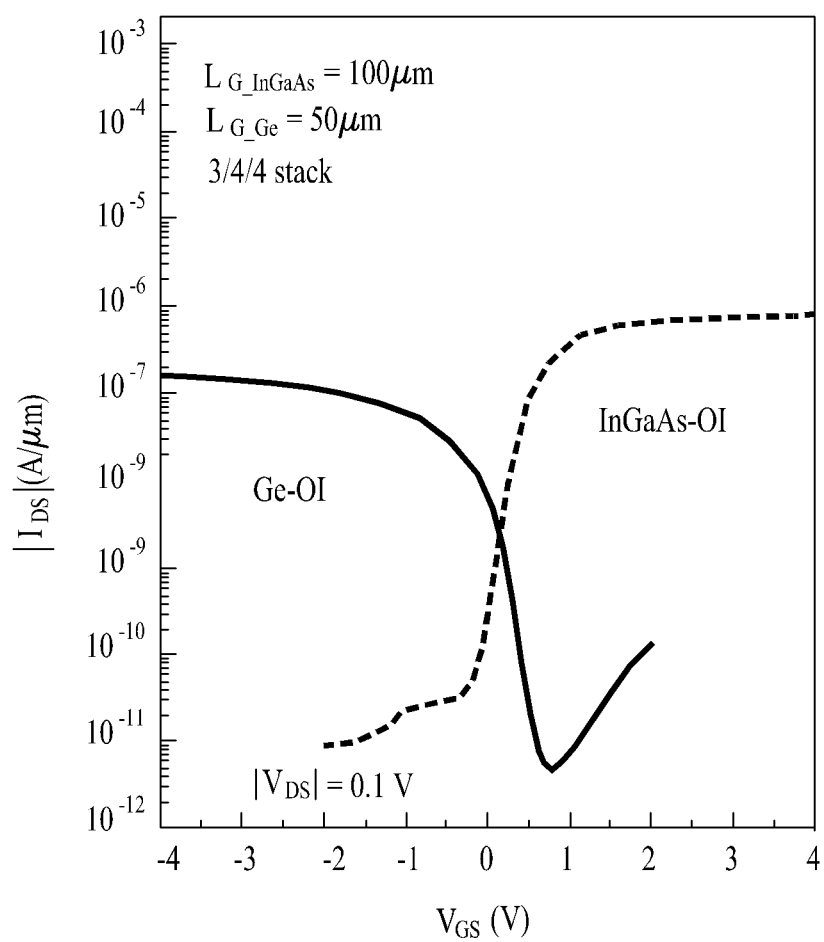
FIGS. 27A, and 27B are drawings for explaining exemplary embodiments of a device according to various embodiments.
Figure 27B:
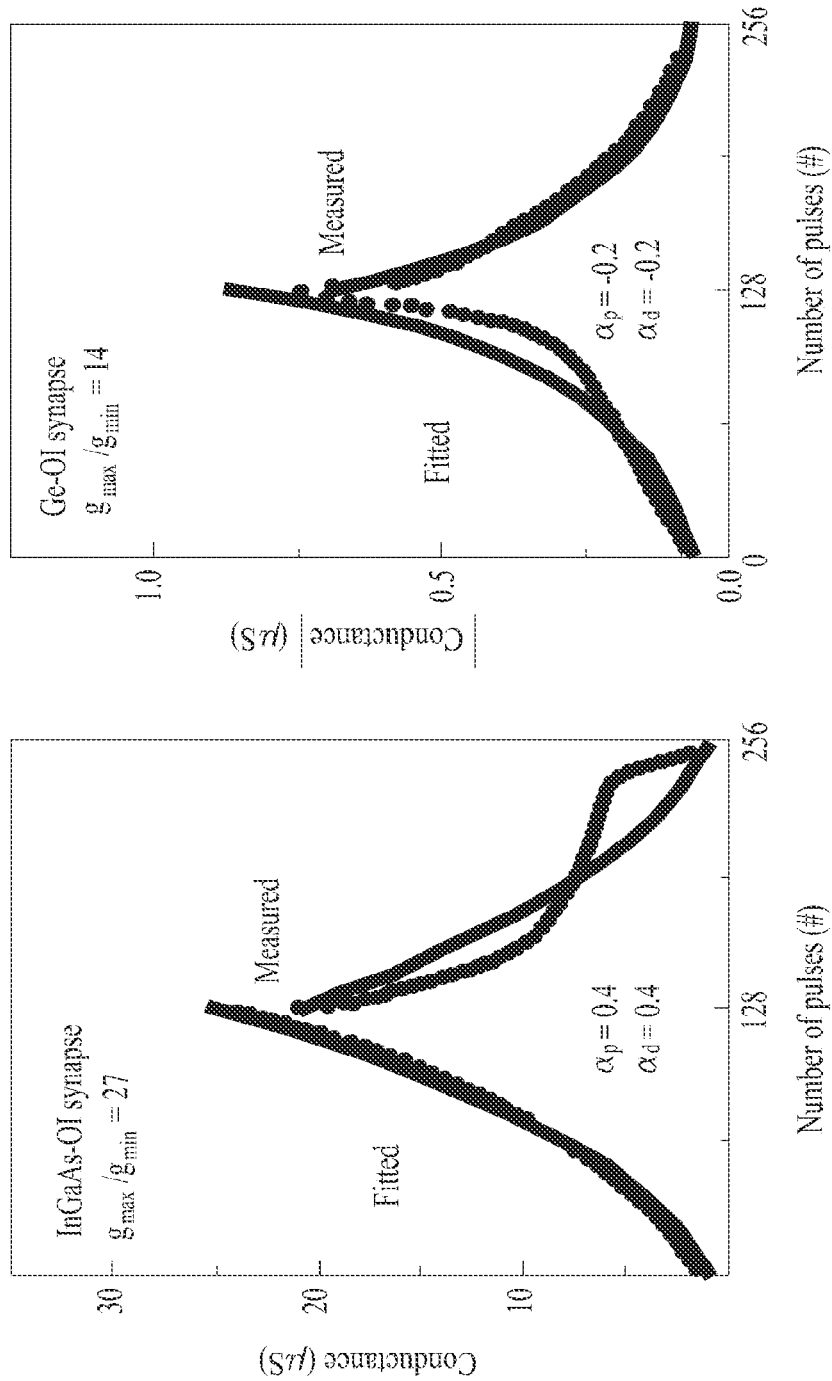

FIGS. 27A and 27B are drawings for explaining exemplary embodiments of the devices 100, 200 according to various embodiments.

For examples, at least one of the first active layer 131, 231 or the second active layer 151, 251 may include at least one of Si (Silicon), TMD (Transition Metal Dichalcogenide), InGaAs (Indium Gallium Arsenide), or Ge (Germanium), and may be successfully manufactured. At this time, at least one of the first active layer 131, 231 or the second active layer 151, 251 may be respectively stacked on at least one of the substrate 110, 120 or the insulating element 140, 240 based on low-temperature stack process or low-temperature element manufacture process.

In one example, on the base substrate 111, 211 made of Si, when the first oxide film 113, 213 made of AL2O3 is stacked, the first active layer 131, 231 including InGaAs may be successfully stacked on the first oxide film 113, 213. Similarly, on the insulating member 141, 241 made of Si, when the second oxide film 143, 243 made of AL2O3 is stacked, the second active layer 151, 251 including InGaAs may be successfully stacked on the second oxide film 143, 243.

In another example, on the base substrate 111, 211 made of Si, when the first oxide film 113, 213 made of SiO2 is stacked, the first active layer 131, 231 including Ge may be successfully stacked on the first oxide film 113, 213. Similarly, on the insulating member 141, 241 made of Si, when the second oxide film 143, 243 made of SiO2 is stacked, the second active layer 151, 251 including Ge may be successfully stacked on the second oxide film 143, 243.

As including at least one of the first active layer 131, 231 or the second active layer 151, 251 as described above, the neuron block 121, 221 may implement performance capable of computing function according to a plurality of neurons as shown in FIG. 27A. Furthermore, as including at least one of the first active layer 131, 231 or the second active layer 151, 251 as described above, the synapse block 123, 223 may implement performance capable of signal transmitting and memory function according to a plurality of synapses as shown in FIG. 27B.

According to various embodiments, it may minimize signal transmission pathway in the device 100, 200 implementing artificial neural network. In other words, as the neuron block 121, 221 functioning as neurons and the synapse block 123, 223 functioning as synapses are stacked together on the single substrate 110, 210 and the neuron block 121, 221 and the synapse block 123, 223 are implemented in a form that the first channel element 130, 230 and the second channel element 150, 250 are stacked, the signal transmission pathway may be minimized between the neuron block 121, 221 and the synapse block 123, 223 and between the first channel element 130, 230 and the second channel element 150, 250. Accordingly, since signal loss on the signal transmission pathway may be minimized, the device 100, 200 may not only operate with reduced power consumption but also be implemented in small size. In addition, since the neuron block 121, 221 and the synapse block 123, 223 may be simultaneously manufactured on one surface of the substrate 110, 210, the resources required to manufacture the device 100, 200 may be reduced.

The device 100, 200 according to various embodiments, which relates to an artificial neural network device, may include the substrate 110, 210, neuron block 121, 221 placed on a partial area on one surface of the substrate 110, 210, the synapse block 121, 221 placed on the remaining area on the surface of the substrate 110, 210, and at least one coupling element electrically connecting the neuron block and the synapse block.

According to various embodiments, the neuron block 121, 221 and the synapse block 123, 223 may include at least one first channel element 130, 230 respectively arranged on the surface of the substrate 110, 210, and at least one second channel element 150, 250 respectively stacked on the first channel element 130, 230.

According to various embodiments, the neuron block 121, 221 and the synapse block 123, 223 may respectively further include the connecting elements 160, 260 electrically connecting the first channel element 130, 230 and the second channel element 150, 250.

According to various embodiments, the neuron block 121, 221 and the synapse block 123, 223 respectively further include the insulating element 140, 240 interposed between the first channel element 130, 230 and the second channel element 150, 250 and separating the first channel 130, 230 and the second channel 150, 250 from each other.

According to various embodiments, the connecting elements 160, 260 may penetrate the insulating element 140, 240.

According to various embodiments, the first channel element 130, 230 may include the first active layer 131, 231, the first insulating layer 133, 233, 234 placed on one surface of the first active layer 131, 231, the first G electrode 135, 235 placed on the opposite side of the first active layer 131, 231 with the first insulating layer interposed therebetween, the first S electrode 136, 236 contacting one side of the first active layer 131, 231 and separated from the first G electrode 135, 235, and the first D electrode 137, 237 contacting the other side of the first active layer 131, 231, and separated from the first G electrode 135, 235.

According to various embodiments, the first insulating layer 122, 233, 234 may be formed of a combination of at least two materials.

According to one embodiment, the first insulating layer 133 of the neuron block 121 and the first insulating layer 133 of the synapse block 123 may be formed of the same material.

According to another embodiment, the first insulating layer 234 of the neuron block 221 and the first insulating layer 233 of the synapse block 223 may be formed of different materials.

According to various embodiments, the second channel element 150, 250 may include the second active layer 151, 251, the second insulating layer 153, 253, 254 placed on one surface of the second active layer 151, 251, the second G electrode 155, 255 placed on the opposite side of the second active layer 151, 251 with the second insulating layer 153, 253, 254 interposed therebetween, the second S electrode 156, 256 contacting one side of the second active layer 151, 251, and separated from the second G electrode 155, 255, and the second D electrode 157, 257 contacting the other side of the second active layer 151, 251, and separated from the second G electrode 155, 255.

According to various embodiments, the second insulating layer 153, 253, 254 may be formed of a combination of at least two different materials.

According to one embodiment, the second insulating layer 153 of the neuron block 121 and the second insulating layer 153 of the synapse block 123 may be formed of the same material.

According to another embodiment, the second insulating layer 254 of the neuron block 221 and the second insulating layer 253 of the synapse block 223 may be formed of different materials.

According to various embodiments, the connecting elements 160, 260 may electrically connect the first S electrode 136, 236 and the second S electrode 156, 256, and may electrically connect the first D electrode 137, 237 and the second D electrode 157, 257.

According to various embodiments, at least one of the first active layer 131, 231 or the second active layer 151, 251 may include at least one of Si (Silicon), TMD (Transition Metal Dichalcogenide), InGaAs (Indium Gallium Arsenide), or Ge (Germanium).

The manufacturing method of the device 100, 200 according to various embodiments, which relates to a manufacturing method of an artificial neural network device, may include preparing the substrate 110, 210, forming the neuron block 121, 221 and the synapse block 123, 223 together on one surface of the substrate 110, 210, and electrically connecting the neuron block and the synapse block through at least one coupling element.

According to various embodiments, the forming the neuron block 121, 221 and the synapse block 123, 223 together may include forming at least one first channel element 130, 230 on the surface of the substrate 110, 210, and forming at least one second channel element 150, 250 to be respectively stacked on the first channel element 130, 230.

According to various embodiments, the forming the neuron block 121, 221 and the synapse block 123, 223 may further include forming the connecting elements 160, 260 to electrically connect the first channel element 130, 230 and the second channel element 150, 250.

According to various embodiments, the forming the second channel element 150, 250 may include forming the insulating element 140, 240 covering the first channel element 130, 230 on the surface of the substrate 110, 210, and forming the second channel element 150, 250 on the first channel element 130, 230 with the insulating element 140, 240 interposed therebetween.

According to various embodiments, the connecting elements 160, 260 may be formed to penetrate the insulating element 140, 240.

According to various embodiments, the first channel element 130 230 may include the first active layer 131, 231, the first insulating layer 133, 233, 234 placed on one surface of the first active layer 131, 231, the first G electrode 135, 235 placed on the opposite side of the first active layer 131, 231 with the first insulating layer interposed therebetween, the first S electrode 136, 236 contacting one side of the first active layer 131, 231 and separated from the first G electrode 135, 235, and the first D electrode 137, 237 contacting the other side of the first active layer 131, 231 and separated from the first G electrode 135, 235.

According to various embodiments, the first insulating layer 122, 233, 234 may be formed of a combination of at least two materials.

According to one embodiment, the first insulating layer 133 of the neuron block 121 and the first insulating layer 133 of the synapse block 123 may be formed of the same material.

According to another embodiment, the first insulating layer 234 of the neuron block 221 and the first insulating layer 233 of the synapse block 223 may be formed of different materials.

According to various embodiments, the second channel element 150, 250 may include the second active layer 151, 251, the second insulating layer 153, 253, 254 placed on one surface of the second active layer 151, 251, the second G electrode 155, 255 placed on the opposite side of the second active layer 151, 251 with the second insulating layer interposed therebetween, the second S electrode 156, 256 contacting one side of the second active layer 151, 251 and separated from the second G electrode 155, 255, and the second D electrode 157, 257 contacting the other side of the second active layer 151, 251 and separated from the second G electrode 155, 255.

According to various embodiments, the second insulating layer 153, 253, 254 may be formed of a combination of at least two materials.

According to one embodiment, the second insulating layer 153 of the neuron block 121 and the second insulating layer 153 of the synapse block 123 may be formed of the same material.

According to another embodiment, the second insulating layer 254 of the neuron block 221 and the second insulating layer 253 of the synapse block 223 may be formed of different materials.

According to various embodiments, the connecting elements 160, 260 may electrically connect the first S electrode 136, 236 and the second S electrode 156, 256, and may electrically connect the first D electrode 137, 237 and the second D electrode 157, 257.

According to various embodiments, at least one of the first active layer 131, 231 or the second active layer 151, 251 may include at least one of Si (Silicon), TMD (Transition Metal Dichalcogenide), InGaAs (Indium Gallium Arsenide), or Ge (Germanium).

It should be understood that various embodiments of the disclosure and terms used in the embodiments do not intend to limit technical features disclosed in the disclosure to the particular embodiment disclosed herein; rather, the disclosure should be construed to cover various modifications, equivalents, or alternatives of embodiments of the disclosure. With regard to description of drawings, similar or related components may be assigned with similar reference numerals. As used herein, singular forms of noun corresponding to an item may include one or more items unless the context clearly indicates otherwise. In the disclosure disclosed herein, each of the expressions "A or B", "at least one of A and B", "at least one of A or B", "A, B, or C", "one or more of A, B, and C", or "one or more of A, B, or C", and the like used herein may include any and all combinations of one or more of the associated listed items. The expressions, such as "a first", "a second", "the first", or "the second", may be used merely for the purpose of distinguishing a component from the other components, but do not limit the corresponding components in the importance or the order. It is to be understood that if an element (e.g., a first element) is referred to as "coupled to (functionally or communicatively)" or "connected to" another element (e.g., a second element), it means that the element may be coupled with the other element directly, or via the other element (e.g., a third element).

The term "module" used in the disclosure may include a unit implemented in hardware, software, or firmware and may be interchangeably used with the terms logic, logical block, part, or circuit. The module may be a minimum unit of an integrated part or may be a part thereof. The module may be a minimum unit for performing one or more functions or a part thereof. For example, the module may include an application-specific integrated circuit (ASIC).

According to various embodiments, each component (e.g., the module or the program) of the above-described components may include one or plural entities. According to various embodiments, at least one or more components of the above components or operations may be omitted, or one or more components or operations may be added. Alternatively or additionally, some components (e.g., the module or the program) may be integrated in one component. In this case, the integrated component may perform the same or similar functions performed by each corresponding components prior to the integration. According to various embodiments, operations performed by a module, a programming, or other components may be executed sequentially, in parallel, repeatedly, or in a heuristic method, or at least some operations may be executed in different sequences, omitted, or other operations may be added.

What is claimed is:

1. An artificial neural network device comprising:
    a substrate;
    a neuron block configured to perform substantive computing functions, the neuron block arranged in direct contact with a partial area on one surface of the substrate; and
    a synapse block arranged in direct contact with a remaining area on the surface of the substrate, the synapse block extending in a parallel arrangement with the neuron block, the synapse block electrically connected to the neuron block and configured to transmit signals from the neuron block;
    wherein the neuron block and the synapse block respectively further comprise:
        a first channel element arranged on the surface of the substrate, the first channel element of the neuron block being separate and spaced apart from the first channel element of the synapse block;
        a second channel element stacked on the first channel element, the second channel element of the neuron block being separate and spaced apart from the second channel element of the synapse block; and
        connecting elements electrically connecting the first channel element of the neuron block and the second channel element of the neuron block, and electrically connecting the first channel element of the synapse block and the second channel element of the synapse block, respectively;
    wherein the first channel element of the neuron block and the first channel element of the synapse block respectively further comprise:
        a first active layer;
        a first insulating layer placed on one surface of the first active layer;
        a first gate electrode placed on the opposite side of the first active layer with the first insulating layer interposed therebetween;
        a first source electrode contacting one side of the first active layer, and separated from the first gate electrode; and
        a first drain electrode contacting the other side of the first active layer, and separated from the first gate electrode;

wherein the second channel element of the neuron block and the second channel element of the synapse block respectively further comprise:
- a second active layer;
- a second insulating layer placed on one surface of the second active layer;
- a second gate electrode placed on the opposite side of the second active layer with the second insulating layer interposed therebetween;
- a second source electrode contacting one side of the second active layer, and separated from the second gate electrode; and
- a second drain electrode contacting the other side of the second active layer, and separated from the second gate electrode, wherein the connecting elements extend between the first channel element and the second channel element of the neuron block on opposing sides of the first insulating layer, and between the first channel element and the second channel element of the synapse block on opposing sides of the first insulating layer, respectively, wherein the connecting elements electrically connect the first source electrode and the second source electrode, and electrically connect the first drain electrode and the second drain electrode, respectively, wherein the neuron block and the synapse block respectively further comprise:
- an insulating element interposed between the first channel element and the second channel element, and separating the first channel element and the second channel element from each other, wherein the connecting elements penetrate the insulating element, wherein the first insulating layer of the neuron block and the first insulating layer of the synapse block are formed of different material, and the first insulating layer of the neuron block is thinner than the first insulating layer of the synapse block, wherein the second insulating layer of the neuron block and the second insulating layer of the synapse block are formed of different material, and the second insulating layer of the neuron block is thinner than the second insulating layer of the synapse block, wherein, in both of the neuron block and the synapse block, the first active layer, the first insulating layer, the first gate electrode, the second active layer, the second insulating layer, and the second gate electrode are placed in order, in a direction of stacking the first and second channel elements of the neuron block and the synapse block.

2. The device of claim 1, wherein at least one of the first active layer of the neuron block or the second active layer of the neuron block comprises at least one of Si (Silicon), TMD (Transition Metal Dichalcogenide), InGaAs (Indium Gallium Arsenide), or Ge (Germanium).

3. The device of claim 1, wherein at least one of the first active layer of the synapse block or the second active layer of the synapse block comprises at least one of Si (Silicon), TMD (Transition Metal Dichalcogenide), InGaAs (Indium Gallium Arsenide), or Ge (Germanium).

* * * * *